(12) United States Patent
Park et al.

(10) Patent No.: US 11,675,455 B2
(45) Date of Patent: Jun. 13, 2023

(54) ELECTRONIC DEVICE INCLUDING A SENSOR LAYER

(71) Applicant: Samsung Display Co., Ltd., Yongin-Si (KR)

(72) Inventors: Jinwoo Park, Yongin-si (KR); Taejoon Kim, Seongnam-si (KR); Jungmok Park, Hwaseong-si (KR); Bo-Hwan Lee, Asan-si (KR); Hyun-Wook Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 27 days.

(21) Appl. No.: 17/394,479

(22) Filed: Aug. 5, 2021

(65) Prior Publication Data

US 2022/0137774 A1 May 5, 2022

(30) Foreign Application Priority Data

Oct. 29, 2020 (KR) .................. 10-2020-0142147

(51) Int. Cl.
*G06F 3/041* (2006.01)
*G06F 3/044* (2006.01)
*H01L 27/32* (2006.01)
*H10K 59/40* (2023.01)

(52) U.S. Cl.
CPC ........ *G06F 3/04166* (2019.05); *G06F 3/0418* (2013.01); *G06F 3/0443* (2019.05); *G06F 3/0446* (2019.05); *H01L 27/323* (2013.01); *G06F 3/0412* (2013.01); *G06F 2203/04111* (2013.01)

(58) Field of Classification Search
CPC .. G06F 3/04166; G06F 3/0418; G06F 3/0443; G06F 3/0446; G06F 3/0412; G06F 2203/04111; H01L 27/323
See application file for complete search history.

(56) References Cited

U.S. PATENT DOCUMENTS

| 8,810,543 B1 * | 8/2014 | Kurikawa ........... G06F 3/04166 345/173 |
| 8,860,686 B2 | 10/2014 | Simmons et al. |
| 9,778,797 B2 | 10/2017 | Lee |

(Continued)

FOREIGN PATENT DOCUMENTS

| KR | 10-1687035 | 12/2016 |
| KR | 10-2019-0023320 | 3/2019 |

(Continued)

*Primary Examiner* — Amy Onyekaba
(74) *Attorney, Agent, or Firm* — F. Chau & Associates, LLC

(57) ABSTRACT

An electronic device includes: a sensor layer including a first area and a second area adjacent to the first area; a first driving circuit providing a first driving signal to the sensor layer and receiving first data output from the first area of the sensor layer; and a second driving circuit providing a second driving signal to the sensor layer and receiving second data output from the second area of the sensor layer. The second driving circuit provides intermediate data to the first driving circuit. The intermediate data is obtained based on the second data, and the first driving circuit generates result data based on the first data and the intermediate data.

22 Claims, 17 Drawing Sheets

(56) References Cited

U.S. PATENT DOCUMENTS

| | | | | |
|---|---|---|---|---|
| 2011/0141040 A1* | 6/2011 | Kang | ................... | G06F 3/0446 |
| | | | | 345/173 |
| 2015/0022494 A1* | 1/2015 | Azumi | ................. | G06F 3/0445 |
| | | | | 345/174 |
| 2015/0241924 A1* | 8/2015 | Chang | .................. | G06F 1/1652 |
| | | | | 349/12 |
| 2015/0309634 A1* | 10/2015 | Lee | ...................... | G06F 3/0418 |
| | | | | 345/173 |
| 2016/0147375 A1* | 5/2016 | Bok | ..................... | G06F 3/0448 |
| | | | | 345/175 |
| 2016/0334933 A1* | 11/2016 | Ono | ..................... | G06F 3/0446 |
| 2017/0177153 A1* | 6/2017 | Azumi | ................. | G06F 3/0445 |
| 2018/0039374 A1* | 2/2018 | Azumi | ................. | G06F 3/0445 |
| 2019/0042042 A1* | 2/2019 | Hei | ..................... | G06F 3/0445 |
| 2019/0064958 A1* | 2/2019 | Liu | ..................... | G06F 3/0412 |
| 2019/0129571 A1 | 5/2019 | Choi | | |
| 2022/0011917 A1* | 1/2022 | Zhang | .................. | G06F 3/0446 |
| 2022/0092862 A1* | 3/2022 | Faulkner | ................ | G06V 40/18 |
| 2022/0101766 A1* | 3/2022 | Yang | .................. | G06F 3/04164 |

FOREIGN PATENT DOCUMENTS

| | | |
|---|---|---|
| KR | 10-2019-0048151 | 5/2019 |
| KR | 10-2088906 | 3/2020 |
| KR | 10-2112092 | 5/2020 |

\* cited by examiner

ELECTRONIC DEVICE INCLUDING A SENSOR LAYER

CROSS-REFERENCE TO RELATED APPLICATION

This U.S. non-provisional patent application claims priority under 35 U.S.C. § 119 to Korean Patent Application No. 10-2020-0142147, filed on Oct. 29, 2020, the disclosure of which is incorporated by reference herein in its entirety.

TECHNICAL FIELD

The present disclosure relates to an electronic device including a sensor layer.

DISCUSSION OF THE RELATED ART

Multimedia electronic devices, such as televisions, mobile phones, tablet computers, navigation units, and portable gaming devices, include a display device to display images. The electronic devices typically include an input sensor that provides a touch-based input method allowing users to input information or commands into the electronic device, in addition to input methods, such as a button, a keyboard, a mouse, etc. that may be included in the electronic device.

SUMMARY

According to an embodiment of the present disclosure, an electronic device includes: a sensor layer including a first area and a second area adjacent to the first area; a first driving circuit providing a first driving signal to the sensor layer and receiving first data output from the first area of the sensor layer; and a second driving circuit providing a second driving signal to the sensor layer and receiving second data output from the second area of the sensor layer. The second driving circuit provides intermediate data to the first driving circuit. The intermediate data is obtained based on the second data, and the first driving circuit generates result data based on the first data and the intermediate data.

In an embodiment of the present disclosure, the sensor layer includes: a plurality of first electrodes disposed in the first area and the second area and receiving the first driving signal from the first driving circuit; a plurality of second electrodes disposed in the first area and the second area and receiving the second driving signal from the second driving circuit; a plurality of first cross electrodes disposed in the first area and providing the first data to the first driving circuit; and a plurality of second cross electrodes disposed in the second area and providing the second data to the second driving circuit.

In an embodiment of the present disclosure, the plurality of first cross electrodes include a first intermediate cross electrode disposed between the plurality of second cross electrodes and a first cross electrode of the plurality of first cross electrodes, wherein the plurality of second cross electrodes include a second intermediate cross electrode disposed between the plurality of first cross electrodes and a second cross electrode of the plurality of second cross electrodes, wherein the first data includes first cross data output from the first intermediate cross electrode, wherein the second data includes second cross data output from the second intermediate cross electrode, wherein the first driving circuit receives the first cross data and the second cross data during a first period, and wherein the second driving circuit receives the first cross data and the second cross data during a second period.

In an embodiment of the present disclosure, the electronic device further includes a switch circuit that selectively and electrically connects the first intermediate cross electrode to the first driving circuit or the second driving circuit, and selectively and electrically connects the second intermediate cross electrode to the first driving circuit or the second driving circuit.

In an embodiment of the present disclosure, the intermediate data includes the first cross data provided to the second driving circuit and the second cross data provided to the second driving circuit.

In an embodiment of the present disclosure, the result data includes first result data and second result data, wherein the first result data is obtained based on the first cross data provided to the first driving circuit from the first intermediate cross electrode and the first cross data of the intermediate data, and wherein the second result data is obtained based on the second cross data provided to the first driving circuit from the second intermediate cross electrode and the second cross data of the intermediate data.

In an embodiment of the present disclosure, the first result data is a result value obtained based on the first cross data provided to the first driving circuit from the first intermediate cross electrode and the first cross data of the intermediate data in a one-to-one basis, and the second result data is a result value obtained based on the second cross data provided to the first driving circuit from the second intermediate cross electrode and the second cross data of the intermediate data in a one-to-one basis.

In an embodiment of the present disclosure, the intermediate data is the second data.

In an embodiment of the present disclosure, the first driving circuit generates the result data by comparing a first average value of the first data with a second average value of the second data.

In an embodiment of the present disclosure, the first driving circuit further includes a memory in which a feedback gain according to a difference between the first average value and the second average value is stored.

In an embodiment of the present disclosure, the result data includes the feedback gain, and the first driving circuit outputs the result data to the second driving circuit.

In an embodiment of the present disclosure, the second driving circuit corrects the second data based on the result data.

According to an embodiment of the present disclosure, an electronic device includes: a sensor layer including a first area and a second area adjacent to the first area; a first driving circuit sensing a touch generated in the first area; and a second driving circuit sensing a touch generated in the second area. The second driving circuit generates intermediate data based on data provided from the sensor layer. The second driving circuit outputs the intermediate data to the first driving circuit, and the first driving circuit generates result data based on data obtained from the first area and the intermediate data.

In an embodiment of the present disclosure, the sensor layer includes: a plurality of first electrodes disposed in the first area and the second area and receiving a first driving signal from the first driving circuit; a plurality of second electrodes disposed in the first area and the second area and receiving a second driving signal from the second driving circuit; a plurality of first cross electrodes disposed in the first area and providing first data to the first driving circuit;

and a plurality of second cross electrodes disposed in the second area and providing second data to the second driving circuit.

In an embodiment of the present disclosure, the intermediate data includes data obtained from one first cross electrode nearest to the second area among the plurality of first cross electrodes and one second cross electrode nearest to the first area among the plurality of second cross electrodes.

In an embodiment of the present disclosure, the first driving circuit generates the result data based on the data applied thereto from the one first cross electrode and the one second cross electrode and the intermediate data.

In an embodiment of the present disclosure, the electronic device further includes a main driver that controls the first driving circuit and the second driving circuit, wherein the first driving circuit provides data corresponding to the result data to the main driver.

In an embodiment of the present disclosure, the electronic device further includes a switch circuit that selectively and electrically connects the one first cross electrode to the first driving circuit or the second driving circuit, and selectively and electrically connects the one second cross electrode to the first driving circuit or the second driving circuit.

In an embodiment of the present disclosure, the intermediate data is an average value of the second data.

In an embodiment of the present disclosure, the first driving circuit determines a feedback gain according to a difference between an average value of the first data and an average value of the second data, wherein the first driving circuit outputs the result data comprising the feedback gain to the second driving circuit, and the second driving circuit corrects the second data based on the result data.

According to an embodiment of the present disclosure, an electronic device includes: a sensor layer including a first area and a second area; a first driving circuit configured to receive data output from the first area of the sensor layer and data output from the second area of the sensor layer; and a second driving circuit configured to receive data output from the first area of the sensor layer and data output from the second area of the sensor layer and to output intermediate data to the first driving circuit based on received data from the first area and the second area of the sensor layer. The first driving circuit is configured to generate result data based on the received data from the first and second areas of the sensor layer and the intermediate data from the second driving circuit.

In an embodiment of the present disclosure, the first driving circuit is configured to receive data output from the first area of the sensor layer and data output from the second area of the sensor layer during a first period. A second driving circuit configured to receive data output from the first area of the sensor layer and data output from the second area of the sensor layer during a second period.

BRIEF DESCRIPTION OF THE DRAWINGS

The above and other aspects of the present disclosure will become more apparent by describing in detail embodiments thereof, with reference to the accompanying drawings, in which.

DETAILED DESCRIPTION OF THE EMBODIMENTS

Figure 1:
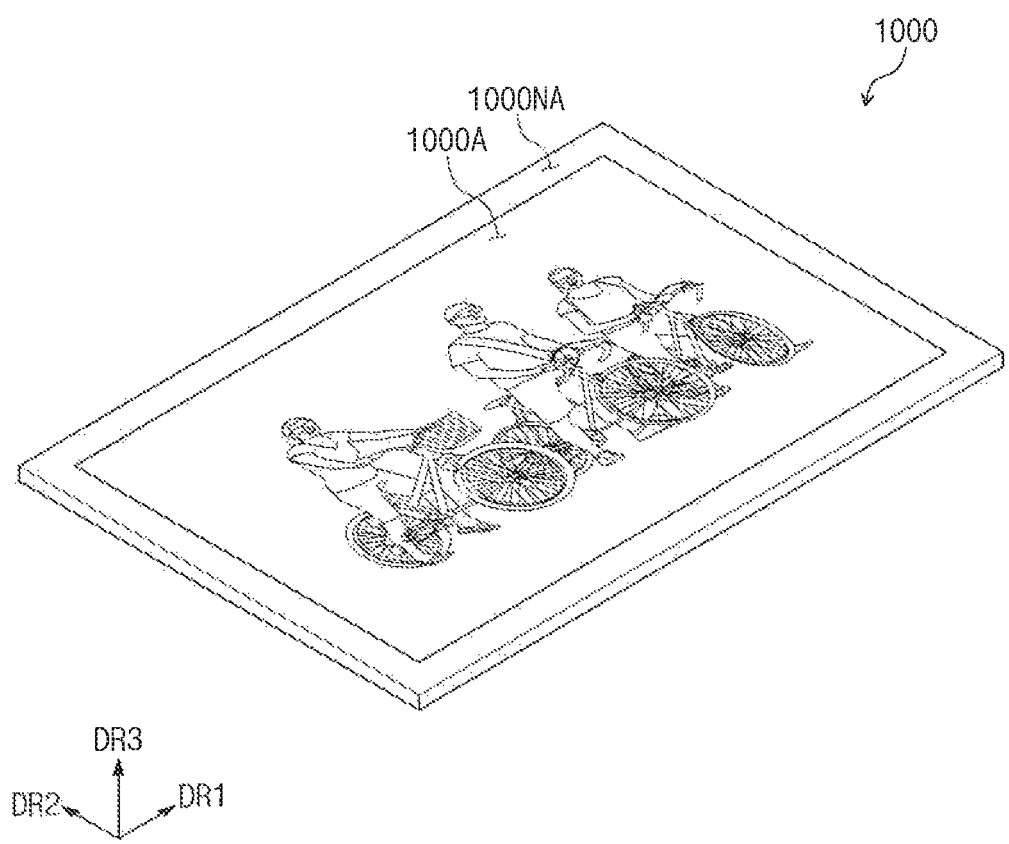
FIG. 1 is a perspective view illustrating an electronic device according to an embodiment of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout the specification and the drawings. In the drawings, the thickness, ratio, and dimension of components may be exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, terms "below" and "beneath" may encompass both an orientation of above, below and beneath. The device may be otherwise oriented (e.g., rotated 90 degrees or at other orientations) and the spatially relative descriptors used herein may be interpreted accordingly.

The term "part" or "unit" as used herein may be intended to mean a software component or a hardware component that performs a specific function. The hardware component may include, for example, a field-programmable gate array (FPGA) or an application-specific integrated circuit (ASIC). The software component may refer to an executable code and/or data used by the executable code in an addressable storage medium. Thus, the software components may be, for example, object-oriented software components, class components, and task components, and may include processes, functions, attributes, procedures, subroutines, segments of program code, drivers, firmware, micro codes, circuits, data, a database, data structures, tables, arrays, or variables.

Hereinafter, the present disclosure will be explained in detail with reference to the accompanying drawings.

FIG. 1 is a perspective view illustrating an electronic device 1000 according to an embodiment of the present disclosure.

Referring to FIG. 1, the electronic device 1000 may be a device activated in response to electrical signals. For example, the electronic device 1000 may be a mobile phone, a foldable mobile phone, a tablet computer, a vehicle navigation unit, a handheld game console, or a wearable device, however, the present disclosure should not be limited thereto or thereby. In FIG. 1, a tablet computer will be described as a representative example of the electronic device 1000.

The electronic device 1000 may include an active area 1000A and a peripheral area 1000NA. The electronic device 1000 may display an image through the active area 1000A. The active area 1000A may include a plane formed by a first direction DR1 and a second direction DR2 crossing the first direction DR1. The peripheral area 1000NA may at least partially surround the active area 1000A.

A thickness direction of the electronic device 1000 may be substantially parallel to a third direction DR3 crossing the first direction DR1 and the second direction DR2. Accordingly, front (or upper) and rear (or lower) surfaces of each member of the electronic device 1000 may be defined with respect to the third direction DR3.

Figure 2:
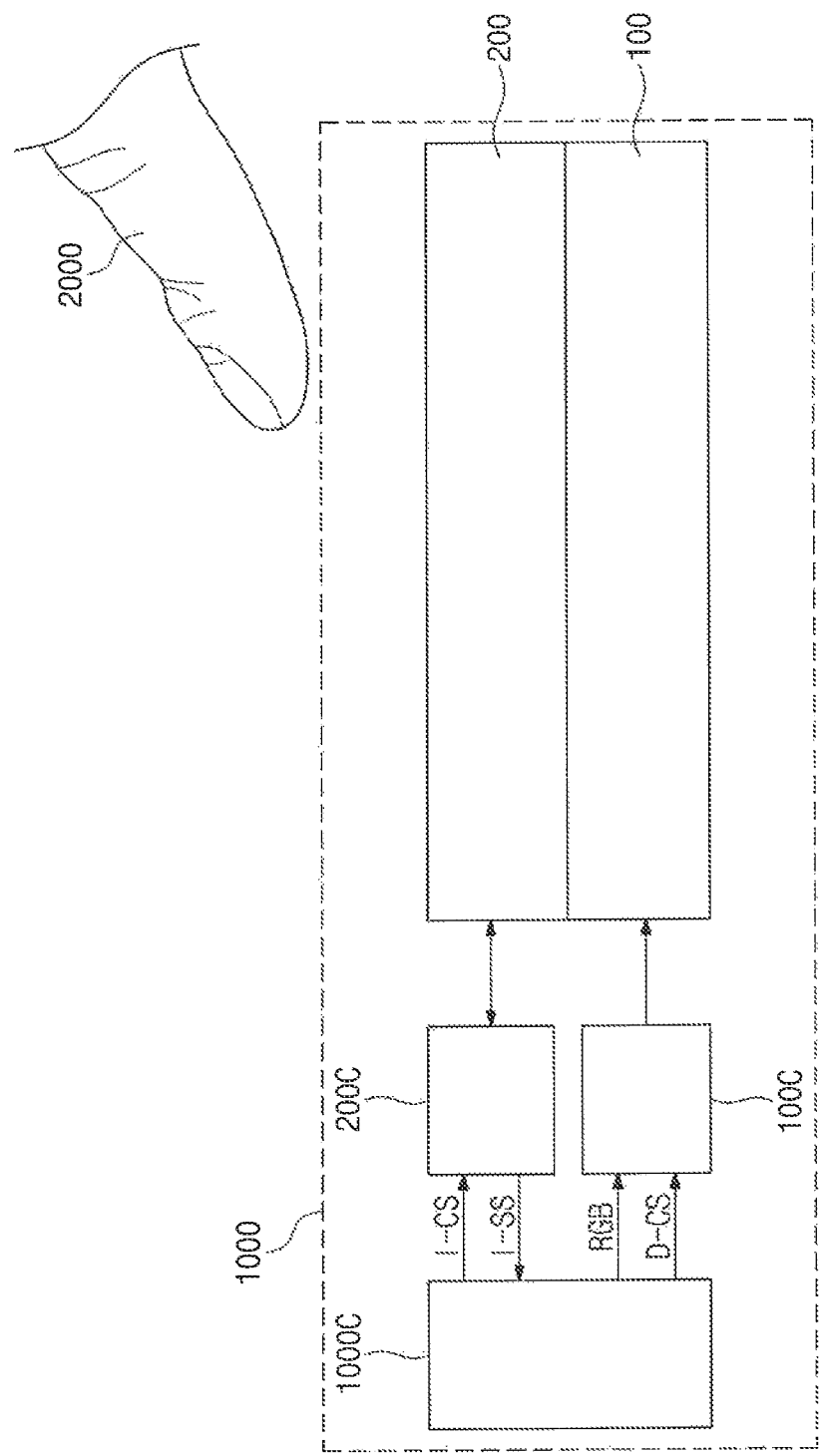
FIG. 2 is a view illustrating an operation of an electronic device according to an embodiment of the present disclosure.

FIG. 2 is a view illustrating an operation of the electronic device 1000 according to an embodiment of the present disclosure.

Referring to FIG. 2, the electronic device 1000 may include a display layer 100, a sensor layer 200, a display driver 1000, a sensor driver 200C, and a main driver 1000C.

The display layer 100 may have a configuration that substantially generates the image. The display layer 100 may be a light emitting type display layer. For example, the display layer 100 may be an organic light emitting display layer, a quantum dot display layer, a micro-LED display layer, or a nano-LED display layer.

The sensor layer 200 may be disposed on the display layer 100. The sensor layer 200 may sense an external input 2000 applied thereto from the outside. The external input 2000 may include an input device that causes a change in capacitance. For example, the sensor layer 200 may sense an input generated by an active-type input device providing a driving signal as well as a user's hand and a passive pen.

The main driver 1000C may control an overall operation of the electronic device 1000. For example, the main driver 1000C may control an operation of the display driver 1000 and the sensor driver 200C. For example, the main driver 1000C may include at least one microprocessor and may be referred to as a host.

The display driver 1000 may drive the display layer 100. For example, the main driver 1000C may further include a graphic controller. The display driver 1000 may receive image data RGB and a control signal D-CS from the main driver 1000C. The control signal D-CS may include a variety of signals. For example, the control signal D-CS may include an input vertical synchronization signal, an input horizontal synchronization signal, a main clock signal, a data enable signal, or the like. The display driver 100C may generate a vertical synchronization signal and a horizontal synchronization signal in response to the control signal D-CS to control a timing at which signals are applied to the display layer 100.

The sensor driver 200C may drive the sensor layer 200. The sensor driver 200C may receive a control signal I-CS from the main driver 1000C. The control signal I-CS may include a mode determination signal to determine a driving mode of the sensor driver 200C and a clock signal.

The sensor driver 200C may calculate coordinate information of the input based on the signals applied thereto from the sensor layer 200 and may provide a coordinate signal I-SS to the main driver 1000C. The coordinate signals I-SS have coordinate information. The main driver 1000C may perform an operation corresponding to the user's input based on the coordinate signal I-SS. For instance, the main driver 1000C may drive the display driver 100C such that an image is displayed on the display layer 100. For example, an image of a new application may be displayed on the display layer 100.

Figure 3A:
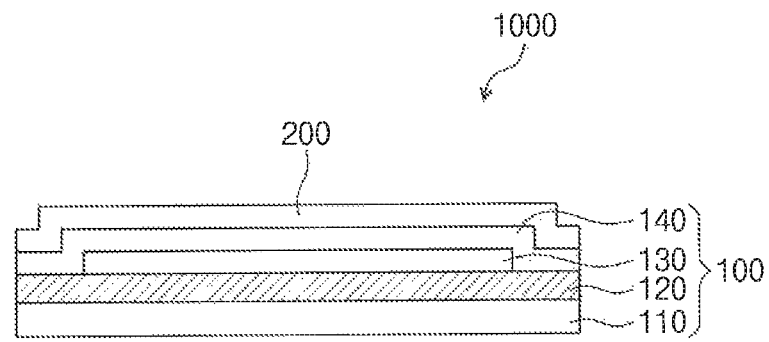
FIG. 3A is a cross-sectional view illustrating an electronic device according to an embodiment of the present disclosure.

FIG. 3A is a cross-sectional view illustrating the electronic device 1000 according to an embodiment of the present disclosure.

Referring to FIG. 3A, the display layer 100 may include a base layer 110, a circuit layer 120, a light emitting element layer 130, and an encapsulation layer 140.

The base layer 110 may be a member that provides a surface on which the circuit layer 120 is disposed. For example, the base layer 110 may be a glass substrate, a metal substrate, or a polymer substrate. However, the present disclosure should not be limited thereto or thereby, and the base layer 110 may be, for example, an inorganic layer, an organic layer, or a composite material layer.

For example, the base layer 110 may have a multi-layer structure. For example, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and/or a perylene-based resin. In the present disclosure, the term "X-based resin", as used herein, refers to the resin that includes a functional group of X.

The circuit layer 120 may be disposed on the base layer 110. The circuit layer 120 may include, for example, an insulating layer, a semiconductor pattern, a conductive pattern, and a signal line. An insulating layer, a semiconductor layer, and a conductive layer may be formed on the base layer 110 by, for example, a coating or depositing process. For example, the insulating layer, the semiconductor layer, and the conductive layer may be selectively patterned through several photolithography processes. The semiconductor pattern, the conductive pattern, and the signal line included in the circuit layer 120 may be formed.

The light emitting element layer 130 may be disposed on the circuit layer 120. The light emitting element layer 130 may include the light emitting element. For example, the light emitting element layer 130 may include an organic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from moisture, oxygen, and foreign substances, such as dust particles.

The sensor layer 200 may be disposed on the display layer 100. The sensor layer 200 may sense an external input applied thereto from the outside. For example, the external input may be the user's input. The user input may include a variety of forms of external inputs, such as a part of user's body, light, heat, pen, or pressure.

The sensor layer 200 may be formed on the display layer 100 through successive processes. For example, the sensor layer 200 may be described as being disposed directly on the display layer 100 such that there are no intervening elements present between the sensor layer 200 and the display layer 100. For example, a separate adhesive member might not be disposed between the sensor layer 200 and the display layer 100.

In addition, the sensor layer 200 may be combined with the display layer 100 by an adhesive member. The adhesive member may include an ordinary adhesive.

For example, the electronic device 1000 may further include an anti-reflective layer and an optical layer, which are disposed on the sensor layer 200. The anti-reflective layer may reduce a reflectance of an external light incident thereto from the outside of the electronic device 1000. The optical layer may control a traveling direction of the light from the display layer 100 thereto to increase a front luminance of the electronic device 1000.

Figure 3B:
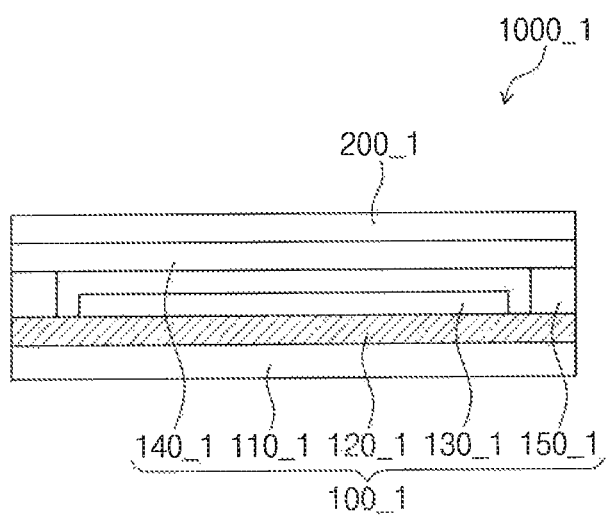
FIG. 3B is a cross-sectional view illustrating an electronic device according to an embodiment of the present disclosure.

FIG. 3B is a cross-sectional view illustrating an electronic device 1000_1 according to an embodiment of the present disclosure.

Referring to FIG. 3B, the electronic device 1000_1 may include a display layer 100_1 and a sensor layer 200_1. The display layer 1001 may include a base substrate 110_1, a circuit layer 120_1, a light emitting element layer 130_1, an encapsulation substrate 140_1, and a coupling member 150_1.

Each of the base substrate 110_1 and the encapsulation substrate 140_1 may be, for example, a glass substrate, a metal substrate, or a polymer substrate, however, the present disclosure should not be limited thereto or thereby.

The coupling member 150_1 may be disposed between the base substrate 110_1 and the encapsulation substrate 140_1. The coupling member 150_1 may couple the encapsulation substrate 140_1 to the base substrate 110_1 or the circuit layer 120_1. The coupling member 150_1 may include an inorganic material or an organic material. For example, the inorganic material may include a frit seal, and the organic material may include a light curable resin or a photo-plastic resin, however, a material for the coupling member 150_1 should not be limited thereto or thereby.

The sensor layer 200_1 may be disposed on the encapsulation substrate 140_1. For example, the sensor layer 200_1 may be disposed directly on the encapsulation substrate 140_1 such that there are no intervening elements present between the sensor layer 200_1 and the encapsulation substrate 140_1. For example, a separate adhesive member might not be disposed between the sensor layer 200_1 and the display layer 100_1, however, the present disclosure should not be limited thereto or thereby. For example, an adhesive layer may be disposed between the sensor layer 200_1 and the encapsulation substrate 140_1.

Figure 4:
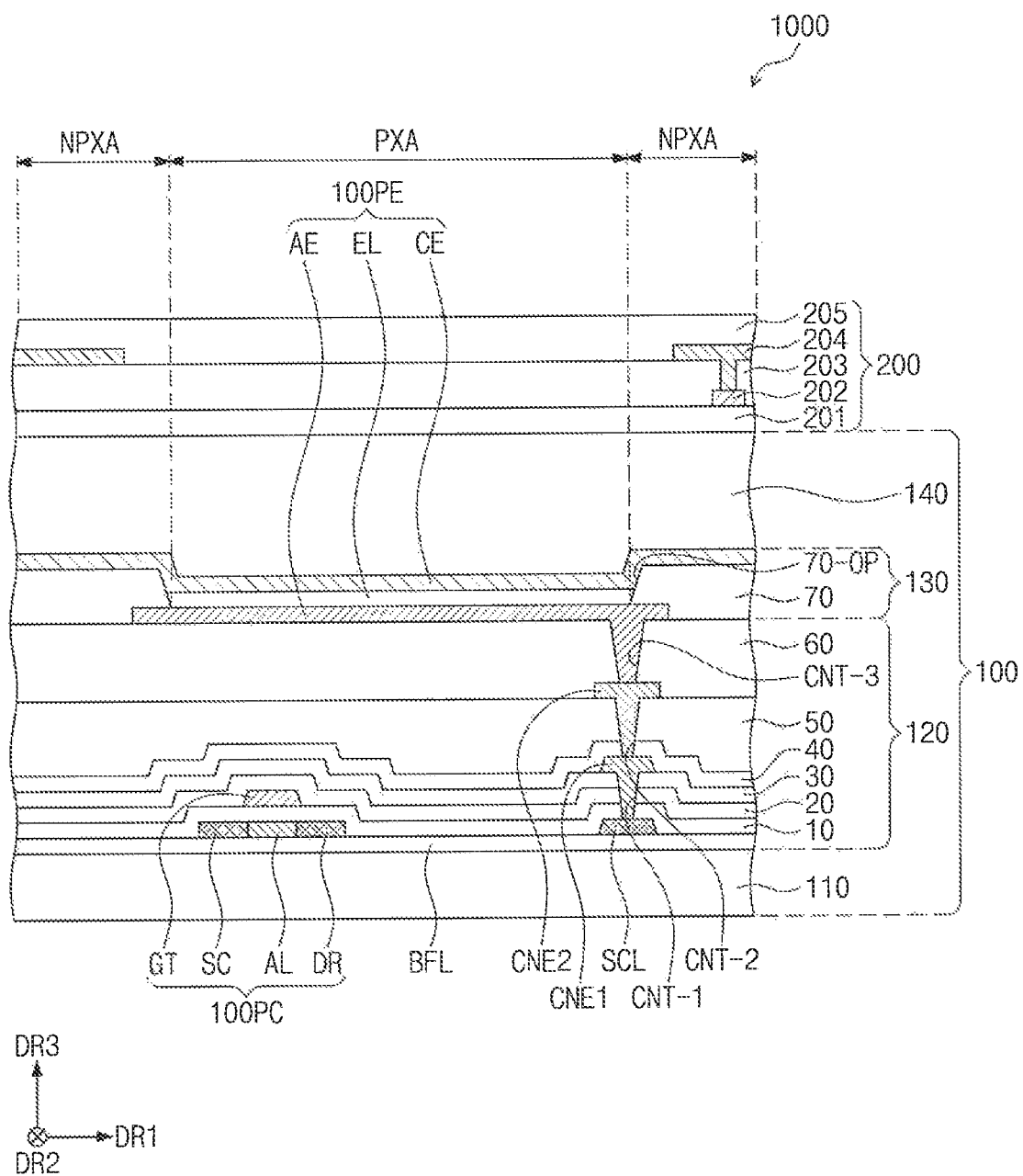
FIG. 4 is a cross-sectional view illustrating an electronic device according to an embodiment of the present disclosure.

FIG. 4 is a cross-sectional view illustrating the electronic device 1000 according to an embodiment of the present disclosure.

Referring to FIG. 4, at least one inorganic layer may be formed on an upper surface of the base layer 110. For example, the inorganic layer may include at least one of aluminum oxide, titanium oxide, silicon oxide, silicon nitride, silicon oxynitride, zirconium oxide, and/or hafnium oxide. The inorganic layer may be formed in multiple layers. The multiple inorganic layers may form a barrier layer and/or a buffer layer. In an embodiment, the display layer 100 may include a buffer layer BFL.

The buffer layer BFL may increase a coupling force between the base layer 110 and the semiconductor pattern. For example, the buffer layer BFL may include at least one of silicon oxide, silicon nitride, and/or silicon oxynitride. For example, the buffer layer BFL may have a stack structure in which the silicon oxide layer and the silicon nitride layer are alternately stacked with each other.

The semiconductor pattern may be disposed on the buffer layer BFL. The semiconductor pattern may include polysilicon, however, the present disclosure should not be limited thereto or thereby. For example, the semiconductor pattern may include amorphous silicon, low temperature polycrystalline silicon, or oxide semiconductor.

FIG. 4 shows a portion of the semiconductor pattern, and the semiconductor pattern may be disposed in other areas. The semiconductor pattern may be arranged with a specific rule over the pixels. The semiconductor pattern may have different electrical properties depending on whether or not it is doped or whether it is doped with an N-type dopant or a P-type dopant. The semiconductor pattern may include a first region having a relatively high conductivity and a second region having a relatively low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially serve as an electrode or signal line. The second region may substantially correspond to an active region (or, e.g., a channel) of the transistor. For example, a portion of the semiconductor pattern may be the active region of the transistor, another portion of the semiconductor pattern may be a source or a drain of the transistor, and the other portion of the semiconductor pattern may be a connection electrode or a connection signal line.

For example, each of the pixels may have an equivalent circuit that includes seven transistors, one capacitor, and a light emitting element, and the equivalent circuit may be changed in various ways. FIG. 4 illustrates one transistor 100PC and the light emitting element 100PE included in the pixel.

A source SC, an active region AL, and a drain DR of the transistor 100PC may be formed from the semiconductor pattern. The source SC and the drain DR may extend in opposite directions to each other from the active region AL in a cross-section. FIG. 4 shows a portion of a connection signal line SCL formed from the semiconductor pattern. For example, the connection signal line SCL may be connected to the drain DR of the transistor 100PC in a plane.

A first insulating layer 10 may be disposed on the buffer layer BFL. The first insulating layer 10 may commonly overlap the pixels (e.g., the single first insulating layer 10 may overlap all of the pixels) and may at least partially cover the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and/or hafnium oxide. In an embodiment, the first insulating layer 10 may have a single-layer structure of a silicon oxide layer. An insulating layer of the circuit layer 120 described later may be an inorganic layer and/or an organic layer and may have a single-layer or multi-layer structure. The inorganic layer may include at least one of the above-mentioned materials, however, the present disclosure is not be limited thereto or thereby.

A gate GT of the transistor 100PC may be disposed on the first insulating layer 10. The gate GT may be a portion of a metal pattern. The gate GT may at least partially overlap the active region AL. The gate GT may be used as a mask in a process of doping the semiconductor pattern.

A second insulating layer 20 may be disposed on the first insulating layer 10 and may at least partially cover the gate GT. The second insulating layer 20 may at least partially overlap the pixels. The second insulating layer 20 may be an inorganic layer and/or an organic layer and may have a single-layer or multi-layer structure. The second insulating layer 20 may include at least one of silicon oxide, silicon nitride, and/or silicon oxynitride. In an embodiment, the second insulating layer 20 may have a multi-layer structure including a silicon oxide layer and a silicon nitride layer.

A third insulating layer 30 may be disposed on the second insulating layer 20. The third insulating layer 30 may have a single-layer or multi-layer structure. In an embodiment, the third insulating layer 30 may have a multi-layer structure including a silicon oxide layer and a silicon nitride layer.

A first connection electrode CNE1 may be disposed on the third insulating layer 30. The first connection electrode CNE1 may be connected to the connection signal line SCL through a contact hole CNT-1 formed in the first, second, and third insulating layers 10, 20, and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 formed in the fourth insulating layer 40 and the fifth insulating layer 50.

A sixth insulating layer 60 may be disposed on the fifth insulating layer 50 and may at least partially cover the second connection electrode CNE2. The sixth insulating layer 60 may be an organic layer.

The light emitting element layer 130 may be disposed on the circuit layer 120. The light emitting element layer 130 may include the light emitting element 100PE. The light emitting element layer 130 may include, for example, an organic light emitting material, a quantum dot, a quantum rod, a micro-LED, or a nano-LED. Hereinafter, as an example, the organic light emitting element will be described as the light emitting element 100PE, however, the present disclosure is not particularly limited thereto.

The light emitting element 100PE may include a first electrode AE, a light emitting layer EL, and a second electrode CE.

The first electrode AE may be disposed on the sixth insulating layer 60. The first electrode AE may be connected to the second connection electrode CNE2 through a contact hole CNT-3 formed in the sixth insulating layer 60.

A pixel definition layer 70 may be disposed on the sixth insulating layer 60 and may at least partially cover a portion of the first electrode AE. An opening 70-OP may be formed in the pixel definition layer 70. At least a portion of the first electrode AE may be exposed through the opening 70-OP of the pixel definition layer 70.

The active area 1000A (refer to FIG. 1) may include a light emitting area PXA and a non-light-emitting area NPXA adjacent to the light emitting area PXA. The non-light-emitting area NPXA may at least partially surround the light emitting area PXA. In an embodiment, the light emitting area PXA may correspond to the portion of the first electrode AE exposed through the opening 70-OP.

The light emitting layer EL may be disposed on the first electrode AE. The light emitting layer EL may be disposed in an area corresponding to the opening 70-OP. For example, the light emitting layer EL may be formed in each of the pixels after being divided into plural portions. When the light emitting layer EL is formed in each of the pixels after being divided into plural portions, each of the light emitting layers EL may emit a light having at least one of blue, red, and green colors, however, the present disclosure is not limited thereto or thereby. For example, the light emitting layer EL may be integrally formed and may be commonly provided to the pixels (e.g., one singular light emitting layer EL may be provided to all of the pixels). In this case, the light emitting layer EL may provide a blue light or a white light.

The second electrode CE may be disposed on the light emitting layer EL. The second electrode CE may have an integral shape and may be commonly disposed over the pixels (e.g., one singular second electrode may be disposed over all of the pixels).

A hole control layer may be disposed between the first electrode AE and the light emitting layer EL. The hole control layer may be commonly disposed in the light emitting area PXA and the non-light-emitting area NPXA (e.g., a single hole control layer may be disposed in both the light emitting area PXA and the peripheral area NPXA). The hole control layer may include a hole transport layer and may further include a hole injection layer. An electron control layer may be disposed between the light emitting layer EL and the second electrode CE. The electron control layer may include an electron transport layer and may further include an electron injection layer. Each of the hole control layer and the electron control layer may be commonly formed in the plural pixels using an open mask (e.g., a single mask may be used to form both the hole control layer and the electron control layer for all of the pixels).

The encapsulation layer 140 may be disposed on the light emitting element layer 130. The encapsulation layer 140 may include an inorganic layer, an organic layer, and an inorganic layer, which are sequentially stacked one on another, however, the layers included in the encapsulation layer 140 are not limited thereto or thereby.

The inorganic layers may protect the light emitting element layer 130 from moisture and oxygen, and the organic layer may protect the light emitting element layer 130 from a foreign substance such as dust particles. The inorganic layers may include, for example, a silicon nitride layer, a silicon oxynitride layer, a silicon oxide layer, a titanium oxide layer, and/or an aluminum oxide layer. The organic layer may include an acrylic-based organic layer, however, the present disclosure is limited thereto or thereby.

The sensor layer 200 may include a base layer 201, a first conductive layer 202, a sensing insulating layer 203, a second conductive layer 204, and a cover insulating layer 205.

The base layer 201 may be an inorganic layer including at least one of silicon nitride, silicon oxynitride, and/or silicon oxide. In addition, the base layer 201 may be an organic layer including an epoxy-based resin, an acrylic-based resin, or an imide-based resin. The base layer 201 may have a single-layer structure or a multi-layer structure of layers stacked in the third direction DR3.

Each of the first conductive layer 202 and the second conductive layer 204 may have a single-layer structure or a multi-layer structure of layers stacked in the third direction DR3.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include conductive polymer such as PEDOT, metal nanowire, graphene, or the like.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

At least one of the sensing insulating layer 203 and/or the cover insulating layer 205 may include an inorganic layer. The inorganic layer may include at least one of, for example, aluminum oxide, titanium oxide, silicon oxide, silicon nitride, silicon oxynitride, zirconium oxide, and/or hafnium oxide.

At least one of the sensing insulating layer 203 and/or the cover insulating layer 205 may include an organic layer. The organic layer may include at least one of, for example, an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

Figure 5:
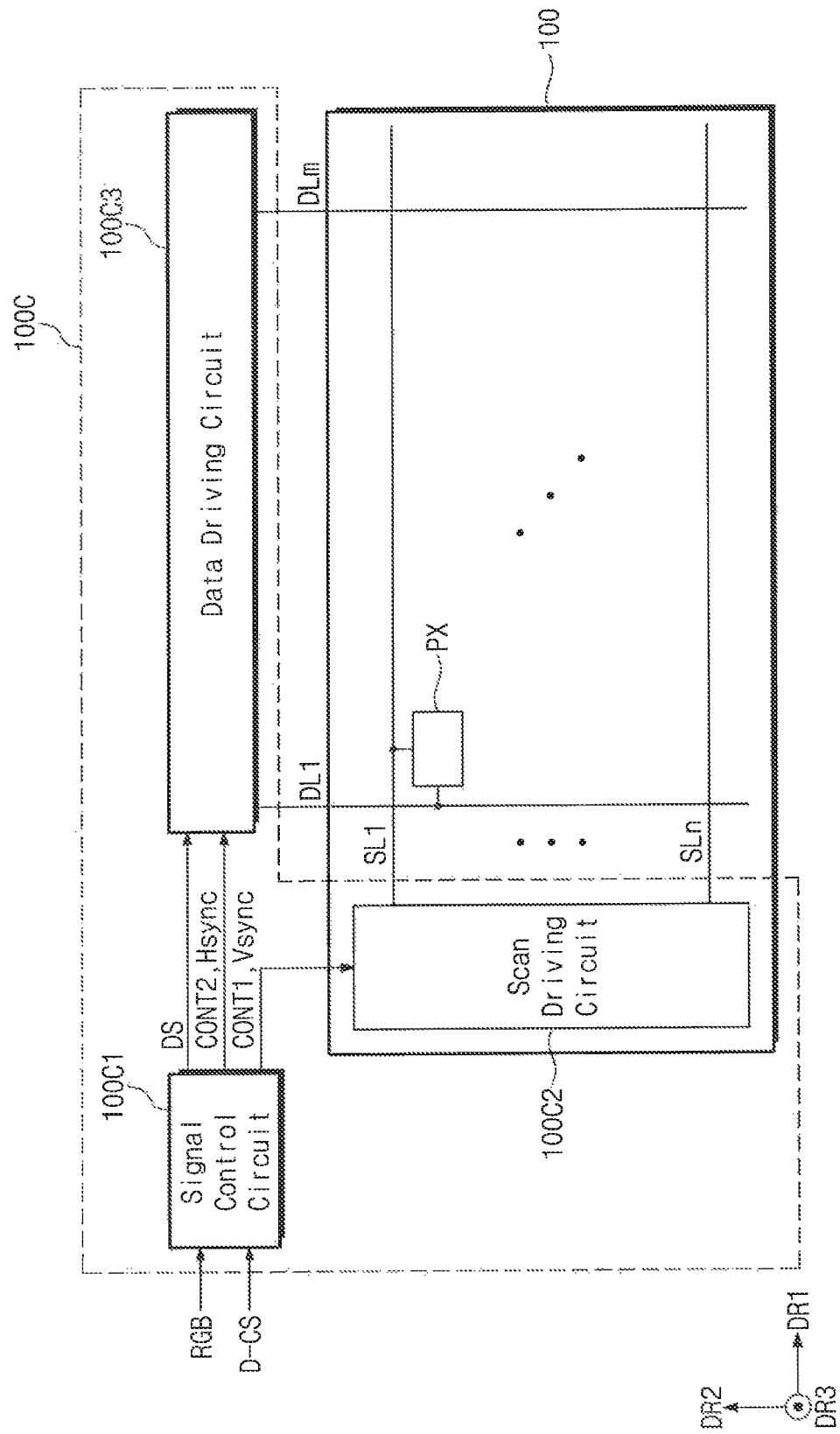
FIG. 5 is a block diagram illustrating a display layer and a display driver according to an embodiment of the present disclosure.

FIG. 5 is a block diagram illustrating the display layer 100 and the display driver 100C according to an embodiment of the present disclosure.

Referring to FIG. 5, the display layer 100 may include a plurality of scan lines SL1 to SLn, a plurality of data lines DL1 to DLm, and a plurality of pixels PX. Each of the pixels PX may be connected to a corresponding data line among the data lines DL1 to DLm and a corresponding scan line among the scan lines SL1 to SLn. The display layer 100 may further include light emitting control lines, and the display driver 100C may further include a light emitting driving circuit that provides control signals to the light emitting control lines. The configuration of the display layer 100 is not limited thereto.

The display driver 100C may include a signal control circuit 100C1, a scan driving circuit 100C2, and a data driving circuit 100C3.

The signal control circuit 100C1 may receive the image data RGB and the control signal D-CS from the main driver 1000C (refer to FIG. 2). The control signal D-CS may include various signals. For example, the control signal D-CS may include an input vertical synchronization signal, an input horizontal synchronization signal, a main clock signal, and a data enable signal.

The signal control circuit 100C1 may generate a first control signal CONT1 and a vertical synchronization signal Vsync based on the control signal D-CS and may output the first control signal CONT1 and the vertical synchronization signal Vsync to the scan driving circuit 100C2. The vertical synchronization signal Vsync may be included in the first control signal CONT1.

The signal control circuit 100C1 may generate a second control signal CONT2 and a horizontal synchronization signal Hsync based on the control signal D-CS and may output the second control signal CONT2 and the horizontal synchronization signal Hsync to the data driving circuit 100C3. The horizontal synchronization signal Hsync may be included in the second control signal CONT2.

In addition, the signal control circuit 100C1 may output a data signal DS, obtained by processing the image data RGB according to an operation condition of the display layer 100, to the data driving circuit 100C3. The first control signal CONT1 and the second control signal CONT2 may be signals used for an operation of the scan driving circuit 100C2 and the data driving circuit 100C3. The present disclosure is not particularly limited thereto.

The scan driving circuit 100C2 may drive the scan lines SL1 to SLn in response to the first control signal CONT1 and the vertical synchronization signal Vsync. In an embodiment, the scan driving circuit 100C2 may be formed through the same process as the circuit layer 120 (refer to FIG. 4) of the display layer 100, however, the present disclosure is limited thereto or thereby. For example, the scan driving circuit 100C2 may be implemented by an integrated circuit (IC) to be mounted on a predetermined area of the display layer 100 or may be electrically connected to the display layer 100 after being mounted on a separate printed circuit board in a chip-on-film (COF) method.

The data driving circuit 10003 may output grayscale voltages to drive the data lines DL1 to DLm in response to the second control signal CONT2, the horizontal synchronization signal Hsync, and the data signal DS from the signal control circuit 100C1. The data driving circuit 100C3 may be implemented by an integrated circuit (IC) to be mounted on a predetermined area of the display layer 100 or may be electrically connected to the display layer 100 after being mounted on a separate printed circuit board in a chip-on-film (COF) method, however, the present disclosure is not limited thereto. For example, the data driving circuit 100C3 may be formed through the same process as the circuit layer 120 (refer to FIG. 4) of the display layer 100.

Figure 6:
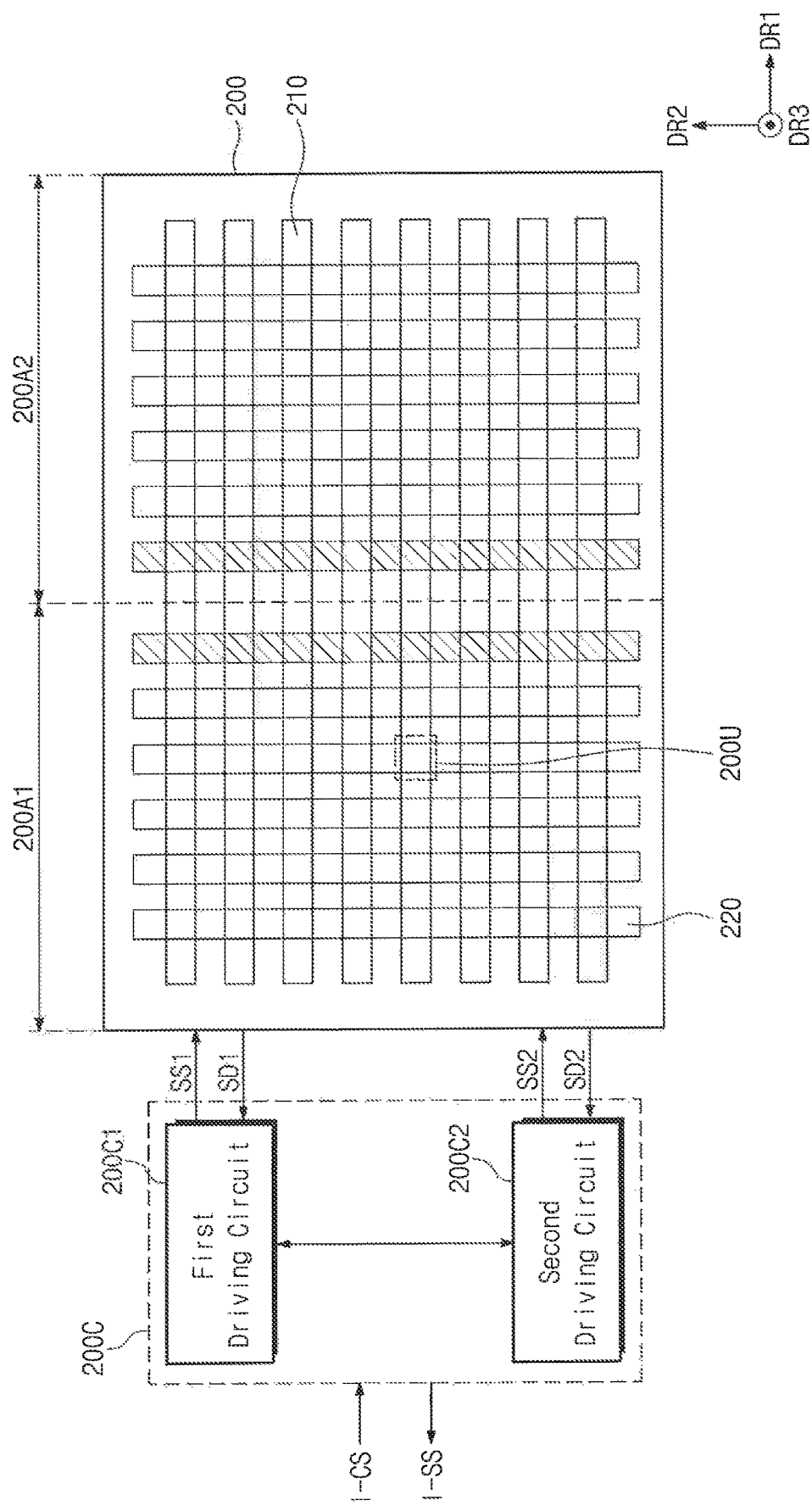
FIG. 6 is a block diagram illustrating a sensor layer and a sensor driver according to an embodiment of the present disclosure.

FIG. 6 is a block diagram illustrating the sensor layer 200 and the sensor driver 200C according to an embodiment of the present disclosure.

Referring to FIG. 6, the sensor layer 200 may include a plurality of electrodes 210 and a plurality of electrodes 220 (hereinafter, referred to as cross electrodes) crossing the electrodes 210. For example, the plurality of electrodes 210 may extend in the first direction DR1, and the plurality of cross electrodes 220 may extend in the second direction DR2 crossing the first direction DR1. The cross electrodes 220 may cross the electrodes 210. The sensor layer 200 may further include a plurality of signal lines connected to the electrodes 210 and the cross electrodes 220. The electrodes 210 and the cross electrodes 220 may have a polygonal shape. For example, the electrodes 210 and the cross electrodes 220 may have a rectangular shape, a bar shape or a stripe shape. The electrodes 210 and the cross electrodes 220 having the bar shape or the stripe shape may increase sensing characteristics of continuous linear input. However, the shape of the electrodes 210 and the cross electrodes 220 are not limited thereto or thereby.

The sensor driver 200C may receive the control signal I-CS from the main driver 1000C (refer to FIG. 2) and may provide the coordinate signal I-SS to the main driver 1000C (refer to FIG. 2). The sensor driver 200C may include a first driving circuit 200C 1 and a second driving circuit 200C2.

The first driving circuit 200C1 and the second driving circuit 200C2 may be implemented by an integrated circuit (IC) to be mounted on a predetermined area of the sensor layer 200 or may be electrically connected to the sensor layer 200 after being mounted on a separate printed circuit board in a chip-on-film (COF) method. The first driving circuit 200C1 and the second driving circuit 200C2 may be implemented in different chips from each other. For example, the first driving circuit 200C1 may be referred to as a first driving chip 200C1, and the second driving circuit 200C2 may be referred to as a second driving chip 200C2.

The sensor layer 200 may include a first area 200A1 and a second area 200A2, which are provided therein. The first area 200A1 and the second area 200A2 may be adjacent to each other in a predetermined direction. For example, the first area 200A1 and the second area 200A2 may be adjacent to each other in the first direction DR1.

The first driving circuit 200C1 may provide a first driving signal SS1 to the sensor layer 200, and the second driving circuit 200C2 may provide a second driving signal SS2 to the sensor layer 200. Each of the first and second driving signals SS1 and SS2 may be referred to as a TX signal.

The first driving circuit 200C1 may receive first data SD1 from the first area 200A1. The second driving circuit 200C2 may receive second data SD2 from the second area 200A2. Each of the first data SD1 and the second data SD2 may be referred to as a RX signal or a sensing signal. The first driving circuit 200C1 may convert the first data SD1 to a digital signal, and the second driving circuit 200C2 may convert the second data SD2 to digital signal. For example, the first driving circuit 200C1 and the second driving circuit 200C2 may amplify and filter analog signals applied thereto, and the first driving circuit 200C1 and the second driving circuit 200C2 may convert the filtered signals to the digital signals.

According to an embodiment of the present disclosure, the first driving circuit 200C1 and the second driving circuit 200C2 may transmit, receive, or transceive signals to and from each other. The second driving circuit 200C2 may provide intermediate data, based on the second data SD2, to the first driving circuit 200C1, and the first driving circuit 200C1 may generate result data obtained by calculating the first data SD1 and the intermediate data to reduce a difference in sensitivity at a boundary between the first area 200A1 and the second area 200A2. For example, the first driving circuit 200C1 may perform a predetermined operation on the basis of the intermediate data provided from the second driving circuit 200C2 to reduce an output distribution of the first driving circuit 200C1 and the second driving circuit 200C2. Accordingly, a difference in data at the boundary between the first area 200A1 and the second area 200A2 may be reduced, and a sensing performance of the electronic device 1000 (refer to FIG. 1) may be increased.

Figure 7:
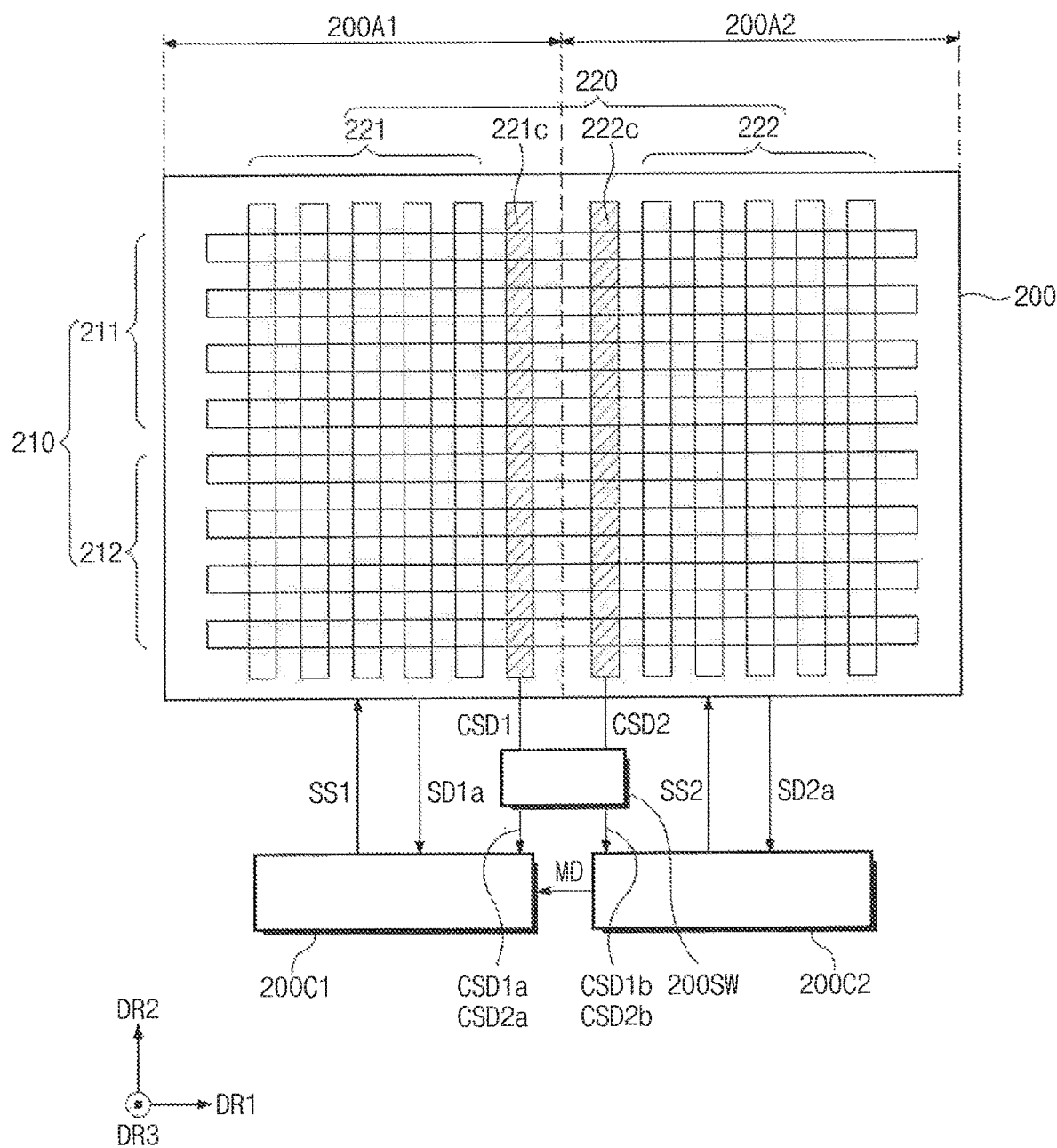
FIG. 7 is a block diagram illustrating a sensor layer and a sensor driver according to an embodiment of the present disclosure.

FIG. 7 is a block diagram illustrating a sensor layer and a sensor driver according to an embodiment of the present disclosure.

Referring to FIG. 7, electrodes 210 may include a plurality of first electrodes 211 and a plurality of second electrodes 212. Each of the first electrodes 211 and the second electrodes 212 may extend in the first direction DR1. The first electrodes 211 may be spaced apart from the second electrodes 212 in the second direction DR2. Each of the first electrodes 211 and the second electrodes 212 may be disposed in both a first area 200A1 and a second area 200A2.

Cross electrodes 220 may include a plurality of first cross electrodes 221 and 221c and a plurality of second cross electrodes 222 and 222c. The first cross electrodes 221 and 221c may be disposed in the first area 200A1, and the second cross electrodes 222 and 222c may be disposed in the second area 200A2. The first cross electrodes 221 and 221c may include a first intermediate cross electrode 221c nearest to the second cross electrodes 222 and 222c. For example, the first intermediate cross electrode 221c is disposed between the second cross electrodes 222 and 222c and a first cross electrode 221 of the first cross electrodes 221 and 221c. The second cross electrodes 222 and 222c may include a second intermediate cross electrode 222c nearest to the first cross electrodes 221 and 221c. For example, the second intermediate cross electrode 222c is disposed between the first cross electrodes 221 and 221c and a second cross electrode 222 of the second cross electrodes 222 and 222c. As another example, the second intermediate cross electrode 222c may be disposed between the first intermediate cross electrode 221c and the second cross electrode 222 of the second cross electrodes 222 and 222c.

A first driving circuit 200C1 may provide a first driving signal SS1 to the first electrodes 211, and a second driving circuit 200C2 may provide a second driving signal SS2 to the second electrodes 212. The first driving signal SS1 and the second driving signal SS2 may be referred to as a TX signal or an output signal.

The first driving circuit 200C1 may receive first data SD1a and CSD1 from the first cross electrodes 221 and 221c, and the second driving circuit 200C2 may receive second data SD2a and CSD2 from the second cross electrodes 222 and 222c. The first data SD1a and CSD1 may include the first cross data CSD1 output from the first intermediate cross electrode 221c, and the second data SD2a and CSD2 may include the second cross data CSD2 output from the second intermediate cross electrode 222c.

The first cross electrodes 221 may be spaced apart from the second intermediate cross electrode 222c by the first intermediate cross electrode 221c interposed therebetween, and the first intermediate cross electrodes 221 may provide signals (e.g., first cross data CSD1) to the first driving circuit 200C1. The second cross electrodes 222 may be spaced apart from the first intermediate cross electrode 221c by the second intermediate cross electrode 222c interposed therebetween, and the second intermediate cross electrodes 222 may provide signals (e.g., second cross data CSD2) to the second driving circuit 200C2.

In an embodiment of the present disclosure, a switch circuit 200SW may be provided to control a connection between the first and second intermediate cross electrodes 221c and 222c and the first driving circuit 200C1 and a connection between the first and second intermediate cross electrodes 221c and 222c and the second driving circuit 200C2. The switch circuit 200SW may be mounted in a predetermined area of the sensor layer 200 or may be provided on a separate printed circuit board. In addition, the switch circuit 200SW may be built in each of the first driving circuit 200C1 (or, e.g., the first driving chip) and the second driving circuit 200C2 (or, e.g., the second driving chip).

The first cross data CSD1, which is output from the first intermediate cross electrode 221c, and the second cross data CSD2, which is output from the second intermediate cross electrode 222c, may be provided to the first driving circuit 200C1 or the second driving circuit 200C2 via the switch circuit 200SW. Hereinafter, for the convenience of explanation, the first and second cross data CSD1a and CSD2a provided to the first driving circuit 200C1 via the switch circuit 200SW and the first and second cross data CSD1b and CSD2b provided to the second driving circuit 200C2 via the switch circuit 200SW may be assigned with different reference numerals from each other.

Hereinafter, Table 1 shows which of the first driving circuit 200C1 and the second driving circuit 200C2 are connected to the cross electrodes 220 in a first period and a second period.

TABLE 1

| | First cross electrode (221) | First intermediate cross electrode (221c) | Second intermediate cross electrode (222c) | Second cross electrode (222) |
| --- | --- | --- | --- | --- |
| First period | First driving circuit (200C1) | First driving circuit (200C1) | First driving circuit (200C1) | Second driving circuit (200C2) |

TABLE 1-continued

| | First cross electrode (221) | First intermediate cross electrode (221c) | Second intermediate cross electrode (222c) | Second cross electrode (222) |
| --- | --- | --- | --- | --- |
| Second period | First driving circuit (200C1) | Second driving circuit (200C2) | Second driving circuit (200C2) | Second driving circuit (200C2) |

During the first period, the switch circuit 200SW may connect the first and second intermediate cross electrodes 221c and 222c to the first driving circuit 200C1. During the second period, the switch circuit 200SW may connect the first and second intermediate cross electrodes 221c and 222c to the second driving circuit 200C2. The first driving circuit 200C1 may receive the first and second cross data CSD1a and CSD2a from the first and second intermediate cross electrodes 221c and 222c, respectively, during the first period, and the second driving circuit 200C2 may receive the first and second cross data CSD1b and CSD2b from the first and second intermediate cross electrodes 221c and 222c, respectively, during the second period.

The second driving circuit 200C2 may generate an intermediate data MD based on the first and second cross data CSD1b and CSD2b, and may output the intermediate data MD to the first driving circuit 200C1. The first driving circuit 200C1 may process the first and second cross data CSD1a and CSD2a and the intermediate data MD to generate the result data. This will be described in detail with reference to FIGS. 8A and 8B.

Figure 8A:
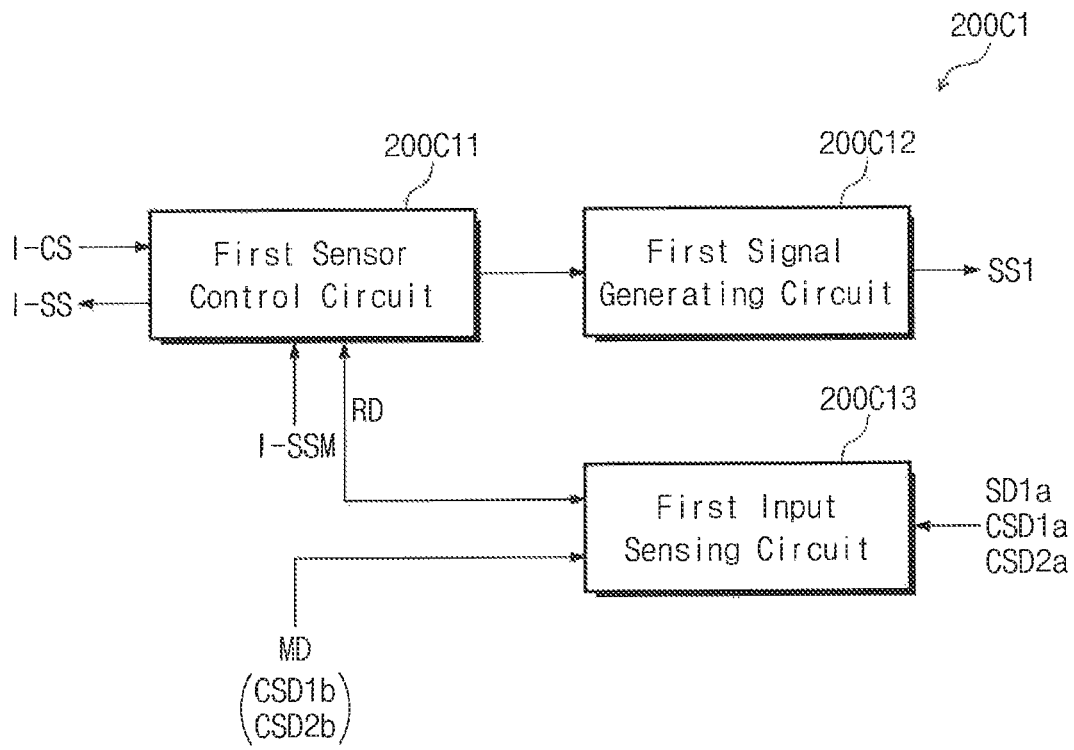
FIG. 8A is a block diagram illustrating a first driving circuit according to an embodiment of the present disclosure.
Figure 8B:
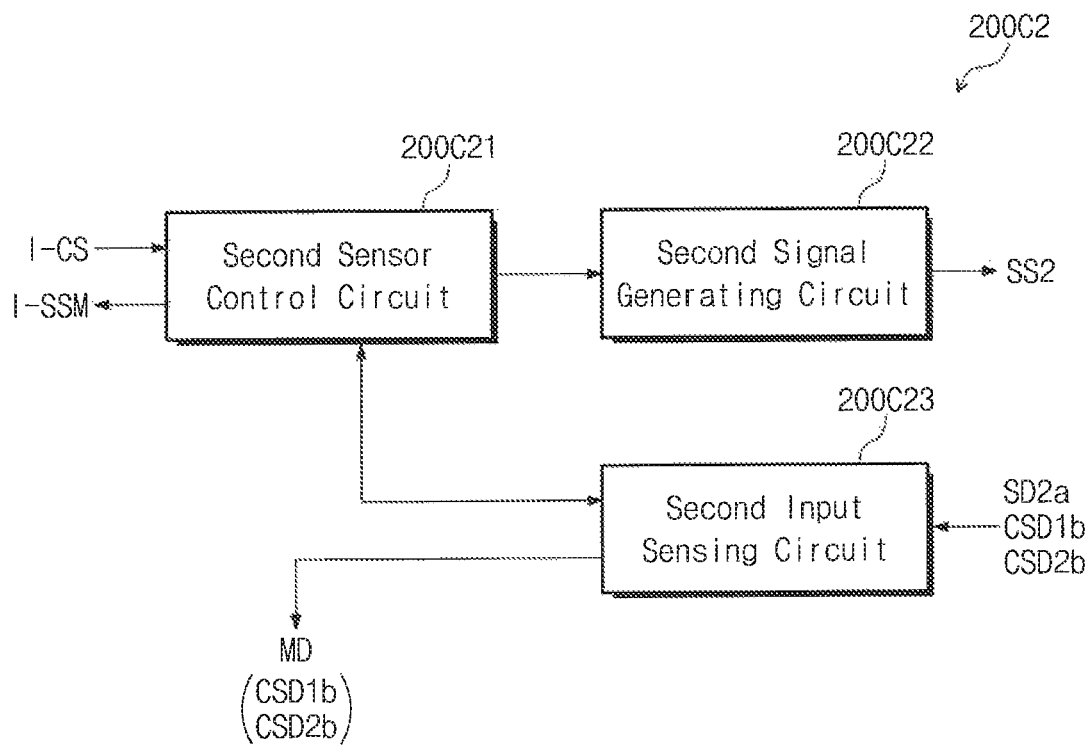
FIG. 8B is a block diagram illustrating a second driving circuit according to an embodiment of the present disclosure.

FIG. 8A is a block diagram illustrating the first driving circuit 200C1 according to an embodiment of the present disclosure, and FIG. 8B is a block diagram illustrating the second driving circuit 200C2 according to an embodiment of the present disclosure.

Referring to FIG. 8A, the first driving circuit 200C1 may include a first sensor control circuit 200C11, a first signal generating circuit 200C12, and a first input sensing circuit 200C13. The first sensor control circuit 200C11, the first signal generating circuit 200C12, and the first input sensing circuit 200C13 may be implemented in a single chip. However, the present disclosure is not limited thereto. For example, the first sensor control circuit 200C11, the first signal generating circuit 200C12, and the first input sensing circuit 200C13 may each be implemented as a separate chip, and may all be connected to one another.

Referring to FIG. 8B, the second driving circuit 200C2 may include a second sensor control circuit 200C21, a second signal generating circuit 200C22, and a second input sensing circuit 200C23. The second sensor control circuit 200C21, the second signal generating circuit 200C22, and the second input sensing circuit 200C23 may be implemented in a single chip. However, the present disclosure is not limited thereto. For example, the second sensor control circuit 200C21, the second signal generating circuit 200C22, and the second input sensing circuit 200C23 may each be implemented as a separate chip, and may all be connected to one another.

Referring to FIGS. 7, 8A, and 8B, the first sensor control circuit 200C11 may control an operation of the first signal generating circuit 200C12 and an operation of the first input sensing circuit 200C13 and may calculate coordinates of an external input based on the signal applied thereto (to the first sensor control circuit 200CC11) from the first input sensing circuit 200C13. The first sensor control circuit 200C11 may receive the control signal I-CS and may provide the coordinate signal I-SS having coordinate information to the main driver 1000C (refer to FIG. 2).

The second sensor control circuit 200C21 may control an operation of the second signal generating circuit 200C22 and an operation of the second input sensing circuit 200C23 and may calculate the coordinates of the external input based on the signal applied thereto (to the second sensor control circuit 200C21) from the second input sensing circuit 200C23. The second sensor control circuit 200C21 may receive the control signal I-CS and may output a coordinate signal I-SSM having the coordinate information to the first sensor control circuit 200C11.

The first sensor control circuit 200C11 may collect information obtained from the first input sensing circuit 200C13 and the second input sensing circuit 200C23 and may provide the coordinate signal I-SS having the coordinate information to the main driver 1000C (refer to FIG. 2), however, the present disclosure is not limited thereto or thereby. For example, the sensor driver 200C (refer to FIG. 6) may further include a microcontroller. The microcontroller may be a chip separated from the first driving circuit 200C1 and the second driving circuit 200C2. In this case, the microcontroller may serve as a host controller of the sensor driver 200C (refer to FIG. 6). For example, the microcontroller may control a timing operation of the first driving circuit 200C1 and the second driving circuit 200C2 and may collect the information obtained by the first driving circuit 200C1 and the second driving circuit 200C2 to provide the coordinate signal I-SS having the coordinate information to the main driver 1000C (refer to FIG. 2).

The first signal generating circuit 200C12 may provide the first driving signal SS1 to the sensor layer 200, for example, the first electrodes 211. The second signal generating circuit 200C22 may provide the second driving signal SS2 to the sensor layer 200, for example, the second electrodes 212.

The first input sensing circuit 200C13 may receive the data SD1a, CSD1a, and CSD2a from the sensor layer 200. The second input sensing circuit 200C23 may receive the data SD2a, CSD1b, and CSD2b from the sensor layer 200. Each of the first and second input sensing circuits 200C13 and 200C23 may convert an analog signal to a digital signal. Each of the first and second input sensing circuits 200C13 and 200C23 may amplify and filter the analog signal applied thereto. Each of the first and second input sensing circuits 200C13 and 200C23 may convert the filtered signal to the digital signal.

The second input sensing circuit 200C23 may generate the intermediate data MD and may output the intermediate data MD to the first driving circuit 200C1. The intermediate data MD may include the first cross data CSD1b and the second cross data CSD2b provided to the second driving circuit 200C2. For example, the first cross data CSD1b and the second cross data CSD2b may be provided to the second input sensing circuit 200C23.

The first input sensing circuit 200C13 may, receive the intermediate data MD from the second driving circuit 200C2. The first input sensing circuit 200C13 may process the first and second cross data CSD1a and CSD2b and the intermediate data MD to generate the result data RD. For example, the result data RD may include first result data, obtained by processing the first cross data CSD1a and the first cross data CSD1b, and the second result data, obtained by processing the second cross data CSD2a and the second cross data CSD2b.

The first result data may be a result value obtained by processing the first cross data CSD1a and the first cross data CSD1b in a one-to-one basis, and the second result data may be a result value obtained by processing the second cross data CSD2a and the second cross data CSD2b in a one-to-one basis. For example, the first result data may be calculated for each value of the first cross data CSD1a and the first cross data CSD1b, and the second result data may be calculated for each value of the second cross data CSD2a and the second cross data CSD2b. The first result data and the second result data may be expressed by the following Equations.

first result data=(first cross data $CSD1a \times 0.5$)+(first cross data $CSD1b \times 0.5$)

second result data=(second cross data $CSD2a \times 0.5$)+ (second cross data $CSD2b \times 0.5$)

According to an embodiment of the present disclosure, among the first cross electrodes 221 and 221c, which output the signals to the first driving circuit 200C1, and the second cross electrodes 222 and 222c, which output the signals to the second driving circuit 200C2, each of the first cross electrode 221c (or the first intermediate cross electrode 221c) and the second cross electrode 222c (or the second intermediate cross electrode 222c), which are nearest to each other, may output the signals to both the first driving circuit 200C1 and the second driving circuit 200C2.

The first driving circuit 200C1 may process the data provided to the first driving circuit 200C1 and the data provided to the second driving circuit 200C2 from the first intermediate cross electrode 221c and the second intermediate cross electrode 222c to reduce the difference in data. Accordingly, the difference in data at a specific area, for example, at the boundary between the first area 200A1 and the second area 200A2 may be reduced.

Figure 9A:
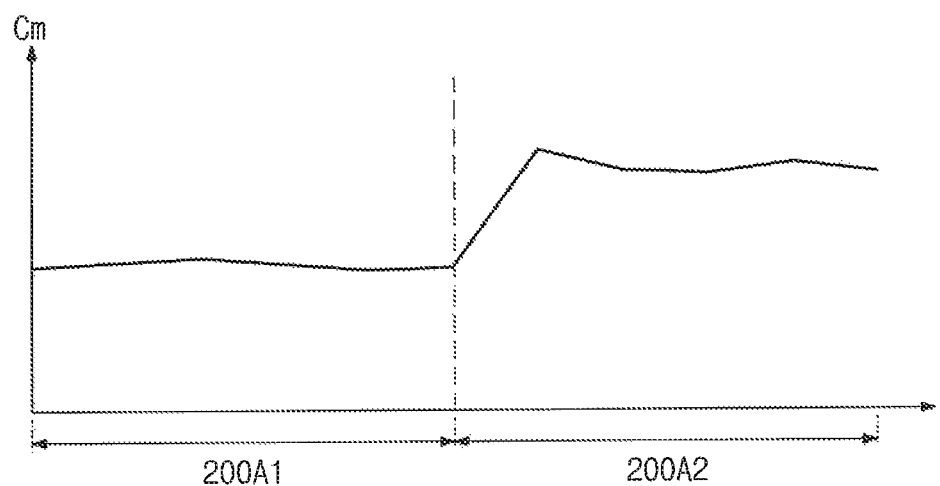
FIG. 9A is a graph illustrating a capacitance according to a position in a sensor layer according to a comparative example.
Figure 9B:
FIG. 9B is a graph illustrating a capacitance according to a position in a sensor layer according to an embodiment of the present disclosure.

FIG. 9A is a graph showing a capacitance according to a position in a sensor layer according to a comparative example, and FIG. 9B is a graph showing a capacitance according to a position in a sensor layer according to an embodiment of the present disclosure.

Referring to FIG. 9A, it is observed that a difference in mutual capacitance increases around the boundary between the first area 200A1 and the second area 200A2. This may cause a decrease in the accuracy of location coordinates. The mutual capacitance may be a capacitance formed between one electrode and one cross electrode. FIGS. 9A and 9B illustrate mutual capacitance data formed between one electrode and cross electrodes arranged in the first direction DR1.

Referring to FIGS. 7, 8A, 8B, and 9B, signals output from the first intermediate cross electrode 221c and the second intermediate cross electrode 222c, which are adjacent to the boundary between the first area 200A1 and the second area 200A2, may be provided to both the first driving circuit 200C1 and the second driving circuit 200C2, and the first driving circuit 200C1 may generate the result data RD based on the signals. For example, the result data RD may correspond to an average value of the data provided to the first driving circuit 200C1 and the data provided to the second driving circuit 200C2. Accordingly, the difference in the mutual capacitance at the boundary between the first area 200A1 and the second area 200A2 may be reduced when compared with the graph shown in FIG. 9A. Thus, the accuracy of the location coordinates may be increased.

Figure 10:
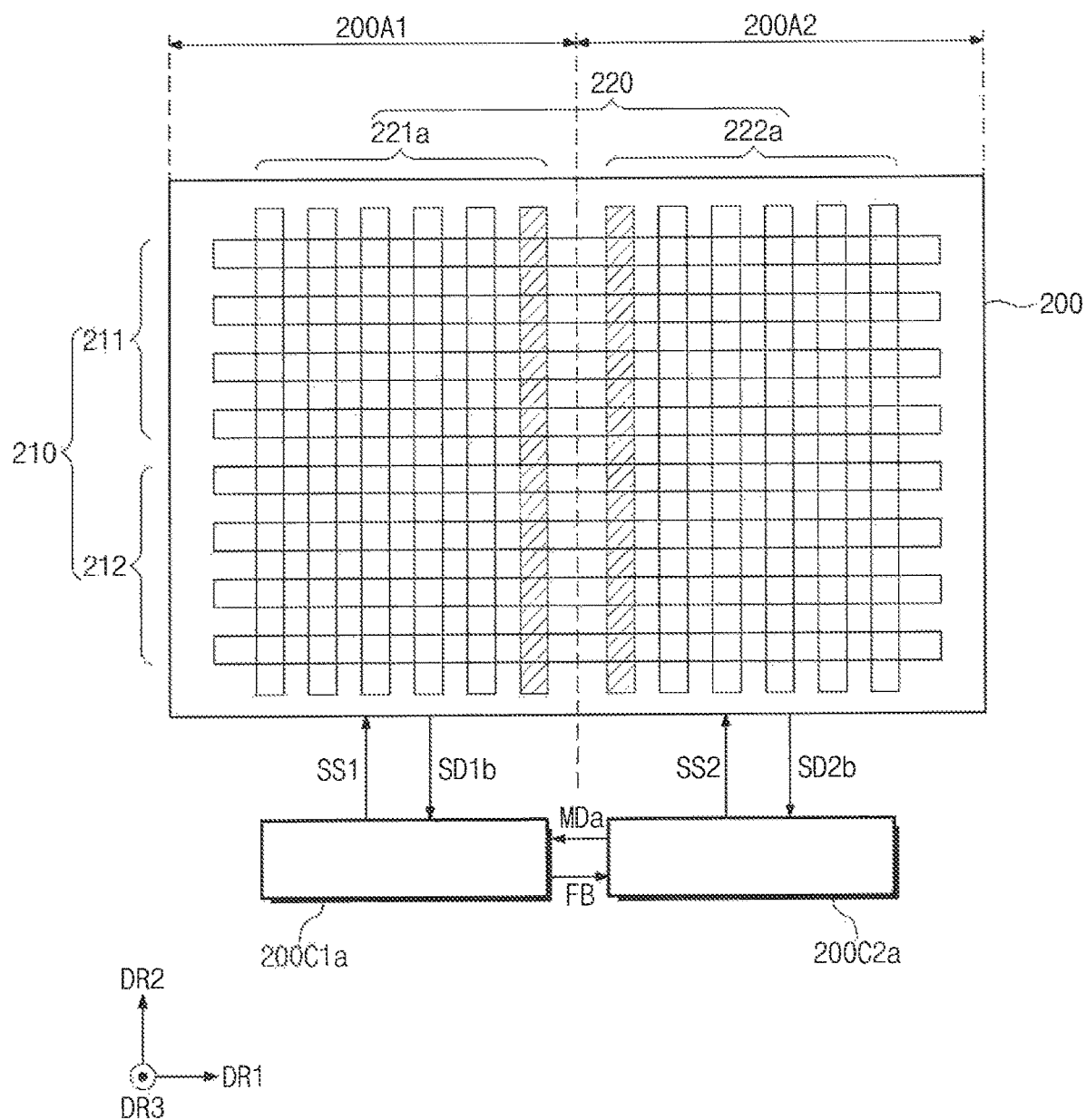
FIG. 10 is a block diagram illustrating a sensor layer and a sensor driver according to an embodiment of the present disclosure.

FIG. 10 is a block diagram illustrating a sensor layer and a sensor driver according to an embodiment of the present disclosure.

Referring to FIG. 10, electrodes 210 may include first electrodes 211 and second electrodes 212. Cross electrodes 220 may include first cross electrodes 221a and second cross electrodes 222a. The first electrodes 211 and the first cross electrodes 221a may be electrically connected to a first driving circuit 200C1a. The second electrodes 212 and the second cross electrodes 222a may be electrically connected to a second driving circuit 200C2a.

The first driving circuit 200C1a may provide a first driving signal SS1 to the first electrodes 211, and the second driving circuit 200C2a may provide a second driving signal SS2 to the second electrodes 212. The first driving signal SS1 and the second driving signal SS2 may be referred to as a TX signal or an output signal.

The first driving circuit 200C1a may receive first data SD1b from the first cross electrodes 221a, and the second driving circuit 200C2a may receive second data SD2b from the second cross electrodes 222a.

The second driving circuit 200C2a may generate intermediate data MDa based on the second data SD2b and may output the intermediate data MDa to the first driving circuit 200C1a. The first driving circuit 200C1a may process the first data SD1b and the intermediate data MDa and may generate result data FB. For example, the result data FB may be based on the first data SD1b and the intermediate data MDa. The first driving circuit 200C1a may output the result data FB to the second driving circuit 200C2a.

Figure 11A:
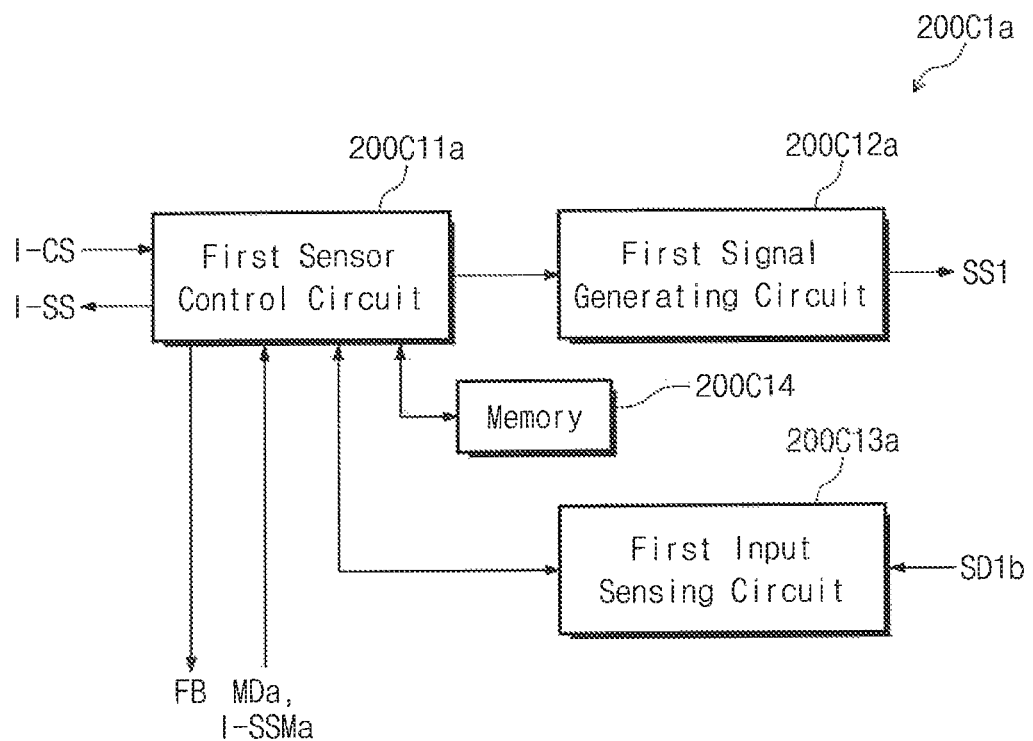
FIG. 11A is a block diagram illustrating a first driving circuit according to an embodiment of the present disclosure.
Figure 11B:
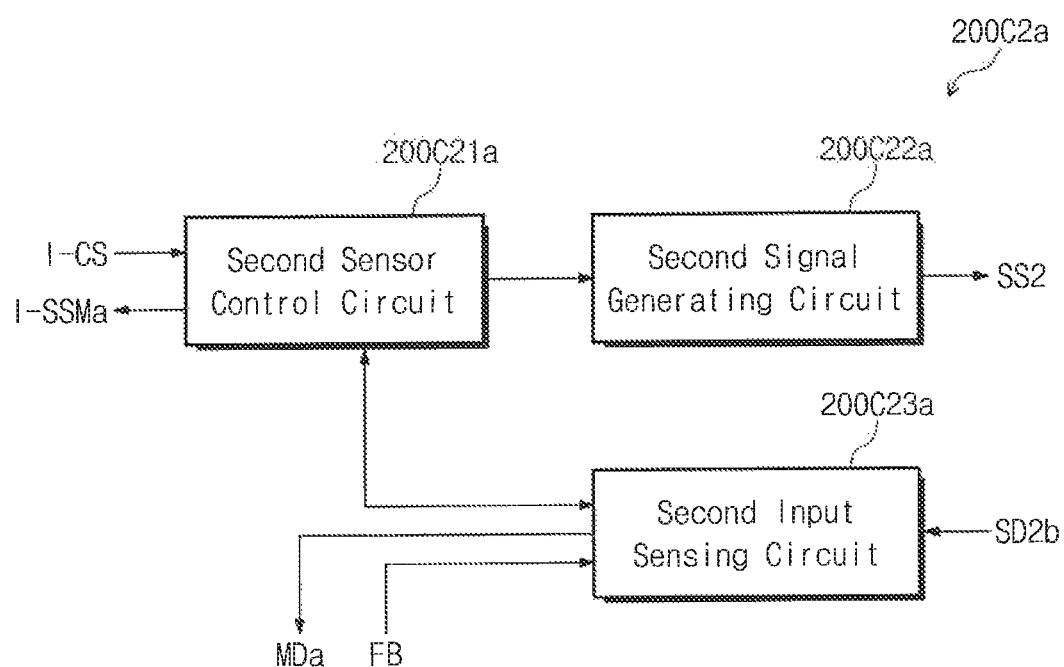
FIG. 11B is a block diagram illustrating a second driving circuit according to an embodiment of the present disclosure.

FIG. 11A is a block diagram illustrating the first driving circuit 200C1a according to an embodiment of the present disclosure. FIG. 11B is a block diagram illustrating the second driving circuit 200C2a according to an embodiment of the present disclosure.

Referring to FIG. 11A, the first driving circuit 200C1a may include a first sensor control circuit 200C11a, a first signal generating circuit 200C12a, a first input sensing circuit 200C13a, and a memory 200C14. The first sensor control circuit 200C11a, the first signal generating circuit 200C12a, the first input sensing circuit 200C13a, and the memory 200C14 may be implemented in a single chip. However, the present disclosure is not limited thereto. For example, the first sensor control circuit 200C11a, the first signal generating circuit 200C12a, the first input sensing circuit 200C13a, and the memory 200C14 may each be implemented as a separate chip, and may all be connected to one another.

Referring to FIG. 11B, the second driving circuit 200C2a may include a second sensor control circuit 200C21a, a second signal generating circuit 200C22a, and a second input sensing circuit 200C23a. The second sensor control circuit 200C21a, the second signal generating circuit 200C22a, and the second input sensing circuit 200C23a may be implemented in a single chip.

Referring to FIGS. 10, 11A, and 11B, the first sensor control circuit 200C11a may control an operation of the first signal generating circuit 200C12a and an operation of the first input sensing circuit 200C13a and may calculate the coordinates of the external input from the signals applied thereto (to the first sensor control circuit 200C11a) from the first input sensing circuit 200C13a. The first sensor control circuit 200C11a may receive a control signal I-CS and may provide a coordinate signal I-SS having coordinate information to the main driver 1000C (refer to FIG. 2).

The second sensor control circuit 200C21a may control an operation of the second signal generating circuit 200C22a and an operation of the second input sensing circuit 200C23a and may calculate the coordinates of the external input from the signals applied thereto (to the second sensor control circuit 200C21a) from the second input sensing circuit 200C23a. The second sensor control circuit 200C21a may receive the control signal I-CS and may output a coordinate signal I-SSMa having coordinate information to the first sensor control circuit 200C11a.

The first sensor control circuit 200C11a may collect information obtained from the first input sensing circuit 200C13a and the second input sensing circuit 200C23a and may provide the coordinate signal I-SS having the coordinate information to the main driver 1000C (refer to FIG. 2).

The second input sensing circuit 200C23a may generate the intermediate data MDa based on the second data SD2b. For example, the intermediate data MDa may be an average value of the second data SD2b. The second input sensing circuit 200C23a may provide the intermediate data MDa to the first driving circuit 200C1a.

The first sensor control circuit 200C11a of the first driving circuit 200C1a may receive the intermediate data MDa from the second driving circuit 200C2a. The first sensor control circuit 200C11a may compare the intermediate data MDa with data provided from the first input sensing circuit 200C13a. For example, the average value of the first data SD1b provided to the first input sensing circuit 200C13a may be compared with the intermediate data MDa.

The first sensor control circuit 200C11a may compare the average value of the first data SD1b with the intermediate data MDa, and then, may calculate a difference value. Then, the result data FB including information on a feedback gain stored in the memory 200C14 may be provided to the second input sensing circuit 200C23a.

Hereinafter, Table. 2 shows the information stored in the memory 200C14. However, the following data is merely one example.

TABLE 2

| Data difference | Feedback gain |
| --- | --- |
| Equal to or greater than −9% and smaller than −7% | 1.08 |
| Equal to or greater than −7% and smaller than −5% | 1.06 |
| Equal to or greater than −5% and smaller than −3% | 1.04 |
| Equal to or greater than −3% and smaller than −1% | 1.02 |
| Equal to or greater than −1% and smaller than +1% | 1.00 |
| Equal to or greater than +1% and smaller than +3% | 0.98 |
| Equal to or greater than +3% and smaller than +5% | 0.96 |
| Equal to or greater than +5% and smaller than +7% | 0.94 |
| Equal to or greater than +7% and smaller than +9% | 0.92 |

When the electronic device 1000 (refer to FIG. 1) starts to operate, for example, when the electronic device 1000 (refer to FIG. 1) is turned on, the first driving circuit 200C1a may generate the result data FB. The result data FB generated at the beginning of the operation of the electronic device 1000 (refer to FIG. 1) may be stored in the memory 200C14. The second driving circuit 200C2a may correct the second data SD2b in response to the result data FB during the operation of the electronic device 1000 (refer to FIG. 1), however, the present disclosure is not limited thereto. For example, the operation of generating the result data FB may be repeated every frame or every several frames. The second input sensing circuit 200C23a may receive the result data FB having the feedback gain from the first driving circuit 200C1a. The second input sensing circuit 200C23a may correct the second data SD2b by taking into account the result data FB, and then, may output the corrected second data SD2b.

Figure 12A:
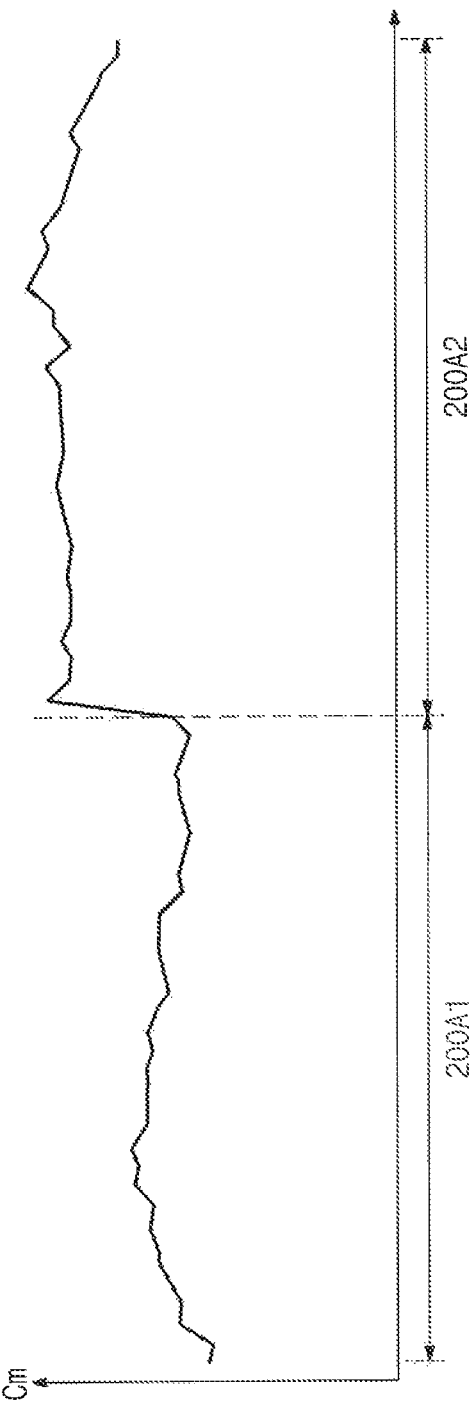
FIG. 12A is a graph illustrating a capacitance according to a position in a sensor layer according to a comparative example.
Figure 12B:
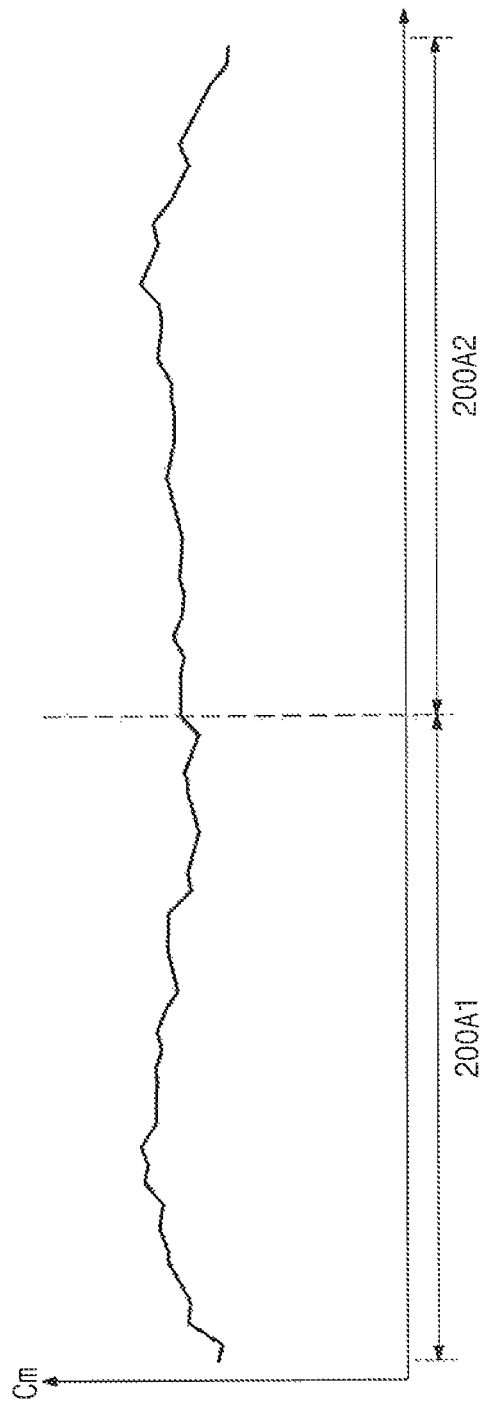
FIG. 12B is a graph illustrating a capacitance according to a position in a sensor layer according to an embodiment of the present disclosure.

FIG. 12A is a graph showing a capacitance according to a position in a sensor layer according to a comparative example, and FIG. 12B is a graph showing a capacitance according to a position in a sensor layer according to an embodiment of the present disclosure.

Referring to FIG. 12A, a difference in mutual capacitance may be large around the boundary between the first area 200A1 and the second area 200A2. This may cause a decrease in the accuracy of the location coordinates.

Referring to FIGS. 10, 11A, 11B, and 12B, the first driving circuit 200C1a may compare the average value of the first data SD1b and the average value of the second data SD2b and may provide the result data FB including the information on the feedback gain to the second driving circuit 200C2a. Accordingly, the second driving circuit 200C2a may receive the result data FB from the first driving circuit 200C1a and may correct the second data SD2b based on the result data FB. Thus, the difference in mutual capacitance between the first area 200A1 and the second area 200A2 may be reduced lower than that indicated by the graph shown in FIG. 12A.

Figure 13:
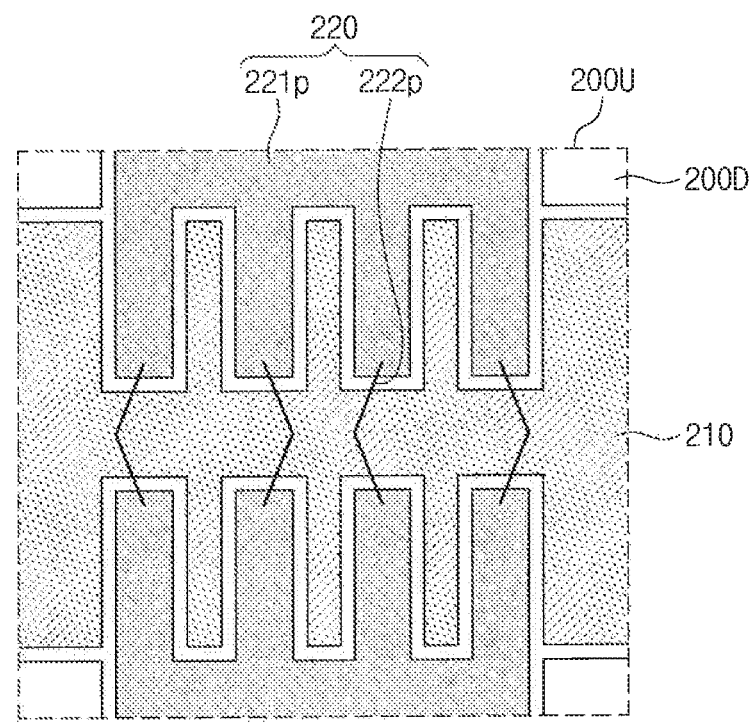
FIG. 13 is an enlarged plan view showing one sensing unit shown in FIG. 6.

FIG. 13 is an enlarged plan view showing one sensing unit shown in FIG. 6.

Referring to FIG. 13, a portion of one electrode 210 and a portion of one cross electrode 220 may form one sensing unit 200U.

The cross electrode 220 may include cross patterns 221p and bridge patterns 222p electrically connected to the cross patterns 221p. The cross patterns 221p may be spaced apart from each other with the electrode 210 interposed therebetween. The bridge patterns 222p may overlap the electrode 210, and the bridge patterns 222p may be insulated from the electrode 210 while crossing the electrode 210. For example, an insulating layer be provided between the bridge patterns 222p and the electrode 210.

The cross patterns 221p and the electrode 210 may be disposed on the same layer as each other, and the bridge patterns 222p may be disposed on a different layer from the cross patterns 221p and the electrode 210. For example, the cross patterns 221p and the electrode 210 may be included in the second conductive layer 204 (refer to FIG. 4), and the bridge patterns 222p may be included in the first conductive layer 202 (refer to FIG. 4). For example, this structure may be referred to as a bottom bridge structure. However, the present disclosure is not limited thereto. For example, the cross patterns 221p and the electrode 210 may be included in the first conductive layer 202 (refer to FIG. 4), and the bridge patterns 222p may be included in the second conductive layer 204 (refer to FIG. 4). For example, this structure may be referred to as a top bridge structure.

In addition, the sensor layer 200 (refer to FIG. 4) may further include a dummy pattern 200D disposed in an area where the cross patterns 221p and the electrode 210 are not disposed. The dummy pattern 200D may prevent the electrode 210 and the cross electrode 220 from being viewed from the outside and may be a pattern that is electrically floated. The dummy pattern 200D may be referred to as a floating pattern or a pattern. The dummy pattern 200D may be disposed on the same layer as the cross patterns 221p and the electrode 210. However, the present disclosure is not limited thereto.

Each of the cross patterns 221p, the electrode 210, and the dummy pattern 200D may have a mesh structure. In this case, each of the cross patterns 221p, the electrode 210, and the dummy pattern 200D may be provided with an opening provided therethrough, however, the present disclosure is not limited thereto or thereby. In addition, each of the cross patterns 221p, the electrode 210, and the dummy pattern 200D may be formed as a transparent single electrode.

FIG. 13 shows the shape of one sensing unit 200U, however, the shape of one sensing unit 200U should not be particularly limited to the shape illustrated in FIG. 13. For example, the shape of the electrode 210 and the shape of the cross electrode 220, i.e., the shape of the one sensing unit 200U, may be changed in various ways as long as the mutual capacitance is formed between the electrode 210 and the cross electrode 220.

Figure 14A:
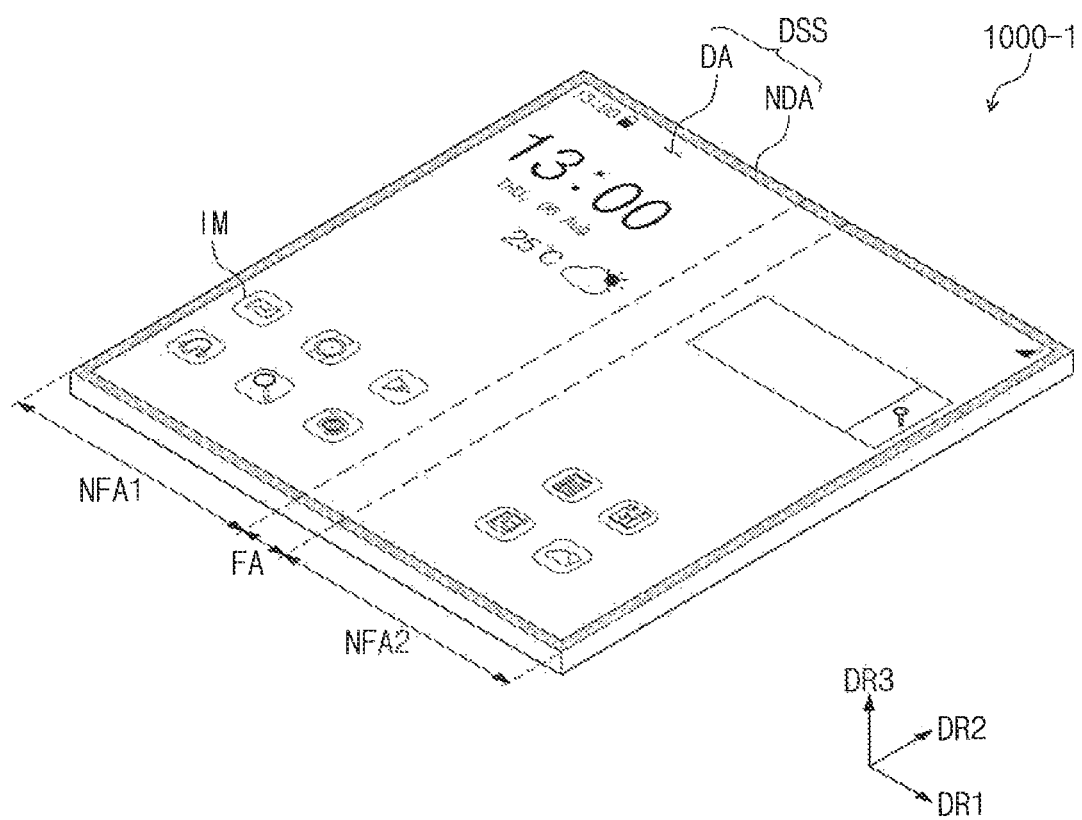
FIG. 14A is a perspective view illustrating an electronic device according to an embodiment of the present disclosure.
Figure 14B:
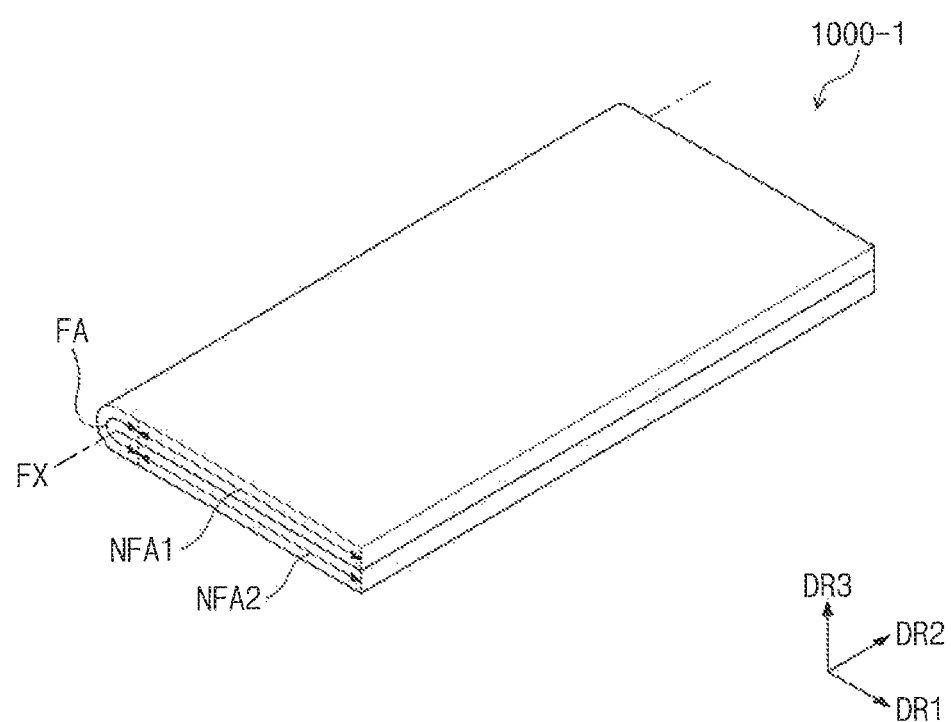
FIG. 14B is a perspective view illustrating a folded state of the electronic device shown in FIG. 14A.

FIG. 14A is a perspective view illustrating an electronic device 1000-1 according to an embodiment of the present disclosure, and FIG. 14B is a perspective view showing the electronic device 1000-1 shown in FIG. 14A in a folded state.

Referring to FIGS. 14A and 14B, the electronic device 1000-1 may include a display surface DSS extending in a first direction DR1 and a second direction DR2 crossing the first direction DR1. The electronic device 1000-1 may provide an image IM through the display surface DSS.

The display surface DSS may include a display area DA and a non-display area NDA adjacent to the display area DA. The display area DA may display the image IM, and the non-display area NDA may not display the image IM. The non-display area NDA may at least partially surround the display area DA, however, the present disclosure is not limited thereto or thereby. For example, a shape of the display area DA and a shape of the non-display area NDA may be changed.

The electronic device 1000-1 may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The first non-folding area NFA1, the folding area FA, and the second non-folding area NFA2 may be sequentially arranged along the first direction DR1 in the electronic device 1000-1.

FIG. 14A shows one folding area FA and two non-folding areas NFA1 and NFA2 as a representative example, however, the number of the folding area FA and the number of the non-folding areas NFA1 and NFA2 is not limited thereto or thereby. For example, the electronic device 1000-1 may include more than two non-folding areas and a plurality of folding areas disposed between the non-folding areas.

Referring to FIG. 14B, the electronic device 1000-1 may be a foldable electronic device 1000-1 that is configured to be folded and unfolded. For example, the folding area FA may be folded about a folding axis FX substantially parallel to the second direction DR2, and thus the electronic device 1000-1 may be folded.

When the electronic device 1000-1 is folded, the first non-folding area NFA1 and the second non-folding areas NFA2 may face each other, and the electronic device 1000-1 may be inwardly folded (e.g., in-folding) such that the display surface DSS is not exposed to the outside. However, the present disclosure is not limited thereto.

According to an embodiment of the present disclosure, the electronic device 1000-1 may be outwardly folded (e.g., out-folding) such that the display surface DSS is exposed to the outside. For example, the electronic device 1000-1 may be folded such that the first non-folding area NFA1 and the second non-folding area NFA2 face away from each other. According to an embodiment of the present disclosure, the electronic device 1000-1 may be configured to be inwardly folded and then outwardly folded, or vice versa, however, the present disclosure is not limited thereto or thereby. The electronic device 1000-1 may be configured to be unfolded, inwardly folded, or outwardly folded.

Figure 15:
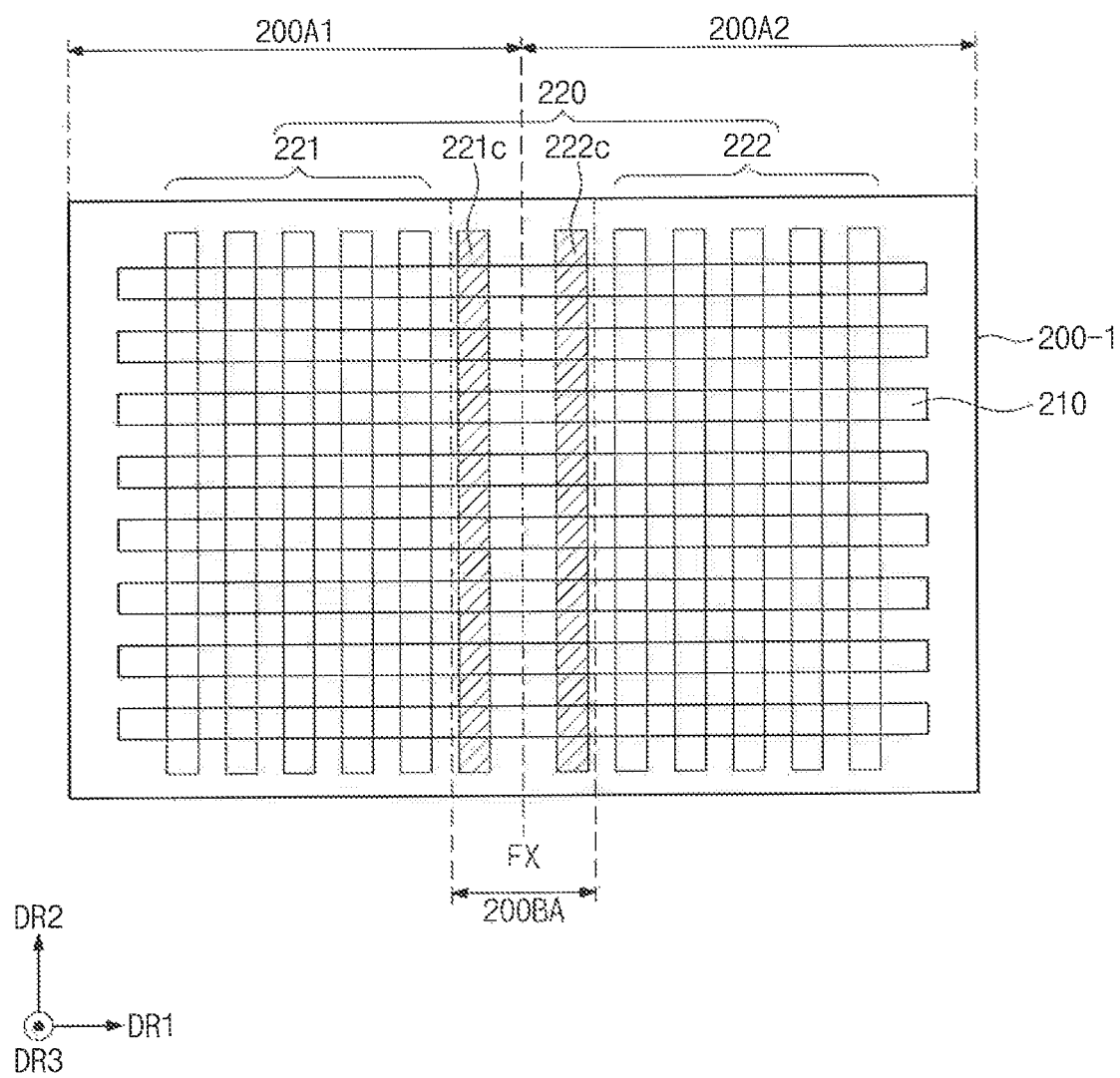
FIG. 15 is a block diagram illustrating a sensor layer and a sensor driver according to an embodiment of the present disclosure.

FIG. 15 is a block diagram showing a sensor layer and a sensor driver according to an embodiment of the present disclosure.

Referring to FIGS. 14A, 14B, and 15, the sensor layer 200-1 may include a first area 200A1 and a second area 200A2, which are provided therein. The sensor layer 200-1 may include electrodes 210 and cross electrodes 220.

The cross electrodes 220 may include a plurality of first cross electrodes 221 and 221c and a plurality of second cross electrodes 222 and 222c. The first cross electrodes 221 and 221c may be disposed in the first area 200A1, and the second cross electrodes 222 and 222c may be disposed in the second area 200A2. The first cross electrodes 221 and 221c may include a first intermediate cross electrode 221c nearest to the second cross electrodes 222 and 222c. The second cross electrodes 222 and 222c may include a second intermediate cross electrode 222c nearest to the first cross electrodes 221 and 221c.

The first intermediate cross electrode 221c and the second intermediate cross electrode 222c may be electrically connected to both the first driving circuit 200C1 (refer to FIG. 6) and the second driving circuit 200C2 (refer to FIG. 6). An area in which the first intermediate cross electrode 221c and the second intermediate cross electrode 222c are disposed may be a boundary area 200BA of the sensor layer 200-1.

The folding axis FX may be in a boundary between the first area 200A1 and the second area 200A2. For example, the folding axis FX may overlap the boundary area 200BA. Accordingly, the folding area FA may also overlap the boundary area 200BA. A size of the folding area FA may be greater than, smaller than, or equal to a size of the boundary area 200BA.

While the present disclosure has been described with reference to embodiments thereof, it will be understood by those of ordinary skill in the art that various changes in form and details may be made thereto without departing from the spirit and scope of the present disclosure.

What is claimed is:

1. An electronic device comprising:
   a sensor layer comprising a first area and a second area adjacent to the first area;
   a first driving circuit providing a first driving signal to the sensor layer and receiving first data output from the first area of the sensor layer; and
   a second driving circuit providing a second driving signal to the sensor layer and receiving second data output from the second area of the sensor layer, wherein the second driving circuit provides intermediate data to the first driving circuit, wherein the intermediate data is obtained based on the second data, and wherein the first driving circuit generates result data based on the first data and the intermediate data.

2. The electronic device of claim 1, wherein the sensor layer comprises:
   a plurality of first electrodes disposed in the first area and the second area and receiving the first driving signal from the first driving circuit;
   a plurality of second electrodes disposed in the first area and the second area and receiving the second driving signal from the second driving circuit;
   a plurality of first cross electrodes disposed in the first area and providing the first data to the first driving circuit; and
   a plurality of second cross electrodes disposed in the second area and providing the second data to the second driving circuit.

3. The electronic device of claim 2, wherein the plurality of first cross electrodes comprise a first intermediate cross electrode disposed between the plurality of second cross electrodes and a first cross electrode of the plurality of first cross electrodes, wherein the plurality of second cross electrodes comprise a second intermediate cross electrode disposed between the plurality of first cross electrodes and a second cross electrode of the plurality of second cross electrodes, wherein the first data comprises first cross data output from the first intermediate cross electrode, wherein the second data comprises second cross data output from the second intermediate cross electrode, wherein the first driving circuit receives the first cross data and the second cross data during a first period, and wherein the second driving circuit receives the first cross data and the second cross data during a second period.

4. The electronic device of claim 3, further comprising a switch circuit that selectively and electrically connects the first intermediate cross electrode to the first driving circuit or the second driving circuit, and selectively and electrically connects the second intermediate cross electrode to the first driving circuit or the second driving circuit.

5. The electronic device of claim 3, wherein the intermediate data comprises the first cross data provided to the second driving circuit and the second cross data provided to the second driving circuit.

6. The electronic device, of claim 5, wherein the result data comprises first result data and second result data, wherein the first result data is obtained based on the first cross data provided to the first driving circuit from the first intermediate cross electrode and the first cross data of the intermediate data, and wherein the second result data is obtained based on the second cross data provided to the first driving circuit from the second intermediate cross electrode and the second cross data of the intermediate data.

7. The electronic device of claim 6, wherein the first result data is a result value obtained based on the first cross data provided to the first driving circuit from the first intermediate cross electrode and the first cross data of the intermediate data in a one-to-one basis, and the second result data is a result value obtained based on the second cross data provided to the first driving circuit from the second intermediate cross electrode and the second cross data of the intermediate data in a one-to-one basis.

8. The electronic device of claim 1, wherein the intermediate data is the second data.

9. The electronic device of claim 1, wherein the first driving circuit generates the result data by comparing a first average value of the first data with a second average value of the second data.

10. The electronic device of claim 9, wherein the first driving circuit further comprises a memory in which a feedback gain according to a difference between the first average value and the second average value is stored.

11. The electronic device of claim 10, wherein the result data comprises the feedback gain, and the first driving circuit outputs the result data to the second driving circuit.

12. The electronic device of claim 11, wherein the second driving circuit corrects the second data based on the result data.

13. An electronic device comprising:
   a sensor layer comprising a first area and a second area adjacent to the first area;
   a first driving circuit sensing a touch generated in the first area; and
   a second driving circuit sensing a touch generated in the second area, wherein the second driving circuit generates intermediate data based on data provided from the sensor layer, wherein the second driving circuit outputs the intermediate data to the first driving circuit, and wherein the first driving circuit generates result data based on data obtained from the first area and the intermediate data.

14. The electronic device of claim 13, wherein the sensor layer comprises:
a plurality of first electrodes disposed in the first area and the second area and receiving a first driving signal from the first driving circuit;
a plurality of second electrodes disposed in the first area and the second area d receiving a second driving signal from the second driving circuit;
a plurality of first cross electrodes disposed in the first area and providing first data to the first driving circuit; and
a plurality of second cross electrodes disposed in the second area and providing second data to the second driving circuit.

15. The electronic device of claim 14, wherein the intermediate data comprises data obtained from one first cross electrode nearest to the second area among the plurality of first cross electrodes and one second cross electrode nearest to the first area among the plurality of second cross electrodes.

16. The electronic device of claim 15, wherein the first driving circuit generates the result data based on the data applied thereto from the one first cross electrode and the one second cross electrode and the intermediate data.

17. The electronic device of claim 16, further comprising a main driver that controls the first driving circuit and the second driving circuit, wherein the first driving circuit provides data corresponding to the result data to the main driver.

18. The electronic device of claim 15, further comprising a switch circuit that selectively and electrically connects the one first cross electrode to the first driving, circuit or the second driving circuit, and selectively and electrically connects the one second cross electrode to the first driving circuit or the second driving circuit.

19. The electronic device of claim 14, wherein the intermediate data is an average value of the second data.

20. The electronic device of claim 19, wherein the first driving circuit determines a feedback gain according to a difference between an average value of the first data and an average value of the second data, wherein the first driving circuit outputs the result data comprising the feedback gain to the second driving circuit, and the second driving circuit corrects the second data based on the result data.

21. An electronic device comprising:
a sensor layer including a first area and a second area;
a first driving circuit configured to receive data output from the first area of the sensor layer and data output from the second area of the sensor layer; and
a second driving circuit configured to receive data output from the first area of the sensor layer and data output from the second area of the sensor layer and to output intermediate data to the first driving circuit based on received data from the first area and the second area of the sensor layer, wherein the first driving circuit is configured to generate result data based on the received data from the first and second areas of the sensor layer and the intermediate data from the second driving circuit.

22. The electronic device of claim 21, wherein the first driving circuit is configured to receive data output from the first area of the sensor layer and data output from the second area of the sensor layer during a first period, and
wherein a second driving circuit configured to receive data output from the first area of the sensor layer and data output from the second area of the sensor layer during a second period.

* * * * *